US011818642B2

(12) United States Patent
Stapleton et al.

(10) Patent No.: US 11,818,642 B2
(45) Date of Patent: *Nov. 14, 2023

(54) DISTRIBUTED ANTENNA SYSTEM

(71) Applicant: DALI WIRELESS, INC., Menlo Park, CA (US)

(72) Inventors: Shawn Patrick Stapleton, Vancouver (CA); Paul Lemson, Woodinville, WA (US); Bin Lin, Burnaby (CA); Albert S. Lee, San Mateo, CA (US)

(73) Assignee: Dali Wireless, Inc., Menlo Park, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/313,658

(22) Filed: May 6, 2021

(65) Prior Publication Data

US 2021/0329527 A1  Oct. 21, 2021

Related U.S. Application Data

(63) Continuation of application No. 16/410,860, filed on May 13, 2019, now Pat. No. 11,006,343, which is a
(Continued)

(51) Int. Cl.
*H04W 40/02* (2009.01)
*H03F 1/32* (2006.01)
(Continued)

(52) U.S. Cl.
CPC .......... *H04W 40/02* (2013.01); *H03F 1/3247* (2013.01); *H03F 3/24* (2013.01);
(Continued)

(58) Field of Classification Search
CPC ..... H04W 40/00; H04W 40/02; H04W 24/02; H04W 24/04; H04W 72/0453;
(Continued)

(56) References Cited

U.S. PATENT DOCUMENTS

| 4,638,248 A | 1/1987 | Schweickert |
| 4,700,151 A | 10/1987 | Nagata |

(Continued)

FOREIGN PATENT DOCUMENTS

| CN | 1484887 A | 3/2004 |
| CN | 1524390 A | 8/2004 |

(Continued)

OTHER PUBLICATIONS

US 9,136,967 B2, 09/2015, Fischer et al. (withdrawn)
(Continued)

*Primary Examiner* — Wei Zhao

(57) ABSTRACT

The present disclosure is a novel utility of a software defined radio (SDR) based Distributed Antenna System (DAS) that is field reconfigurable and support multi-modulation schemes (modulation-independent), multi-carriers, multi-frequency bands and multi-channels. The present invention enables a high degree of flexibility to manage, control, enhance, facilitate the usage and performance of a distributed wireless network such as Flexible Simulcast, automatic traffic load-balancing, network and radio resource optimization, network calibration, autonomous/assisted commissioning, carrier pooling, automatic frequency selection, frequency carrier placement, traffic monitoring, traffic tagging, pilot beacon, etc. As a result, a DAS in accordance with the present invention can increase the efficiency and traffic capacity of the operators' wireless network.

19 Claims, 8 Drawing Sheets

Related U.S. Application Data continuation of application No. 16/059,434, filed on Aug. 9, 2018, now Pat. No. 10,334,499, which is a continuation of application No. 15/223,819, filed on Jul. 29, 2016, now Pat. No. 10,080,178, which is a continuation of application No. 14/800,515, filed on Jul. 15, 2015, now Pat. No. 9,419,837, which is a continuation of application No. 14/260,145, filed on Apr. 23, 2014, now Pat. No. 9,137,078, which is a continuation of application No. 13/211,247, filed on Aug. 16, 2011, now Pat. No. 8,737,300.

(60) Provisional application No. 61/439,940, filed on Feb. 7, 2011.

(51) Int. Cl.
| | | |
|---|---|---|
| *H03F 3/24* | (2006.01) | |
| *H04L 25/03* | (2006.01) | |
| *H04L 27/36* | (2006.01) | |
| *H04W 88/08* | (2009.01) | |
| *H04W 24/02* | (2009.01) | |
| *H04B 1/04* | (2006.01) | |
| *H04W 24/04* | (2009.01) | |
| *H04W 40/00* | (2009.01) | |
| *H04L 27/26* | (2006.01) | |
| *H04W 72/0453* | (2023.01) | |
| *H04B 7/022* | (2017.01) | |
| *H04W 72/04* | (2023.01) | |

(52) U.S. Cl.
CPC ........... *H04B 1/0475* (2013.01); *H04B 7/022* (2013.01); *H04L 25/03343* (2013.01); *H04L 27/2618* (2013.01); *H04L 27/362* (2013.01); *H04W 24/02* (2013.01); *H04W 24/04* (2013.01); *H04W 40/00* (2013.01); *H04W 72/04* (2013.01); *H04W 72/0453* (2013.01); *H04W 88/085* (2013.01); *H03F 2200/336* (2013.01); *H03F 2200/57* (2013.01); *H03F 2201/3224* (2013.01); *H03F 2201/3233* (2013.01); *H04B 2001/0425* (2013.01); *H04L 2025/03414* (2013.01)

(58) Field of Classification Search
CPC ... H04W 88/085; H04B 1/0475; H04B 7/022; H04L 25/03343; H04L 27/2618; H04L 27/362; H03F 1/3247; H03F 3/24
See application file for complete search history.

(56) References Cited

U.S. PATENT DOCUMENTS

| | | |
|---|---|---|
| 4,755,795 A | 7/1988 | Page |
| 4,775,795 A | 10/1988 | Biehl et al. |
| 4,890,300 A | 12/1989 | Andrews |
| 4,929,906 A | 5/1990 | Voyce et al. |
| 4,999,831 A | 3/1991 | Grace |
| 5,049,832 A | 9/1991 | Cavers |
| 5,105,445 A | 4/1992 | Karam et al. |
| 5,107,520 A | 4/1992 | Karam et al. |
| 5,121,412 A | 6/1992 | Borth |
| 5,132,639 A | 7/1992 | Blauvelt et al. |
| 5,396,190 A | 3/1995 | Murata |
| 5,404,378 A | 4/1995 | Kimura |
| 5,457,557 A | 10/1995 | Zarem et al. |
| 5,486,789 A | 1/1996 | Palandech et al. |
| 5,524,286 A | 6/1996 | Chiesa et al. |
| 5,579,341 A | 11/1996 | Smith et al. |
| 5,579,342 A | 11/1996 | Crozier |
| 5,589,797 A | 12/1996 | Gans et al. |
| 5,596,600 A | 1/1997 | Dimos et al. |
| 5,619,202 A | 4/1997 | Wilson et al. |
| 5,621,730 A | 4/1997 | Kelley |
| 5,627,879 A | 5/1997 | Russell et al. |
| 5,644,622 A | 7/1997 | Russell et al. |
| 5,655,220 A | 8/1997 | Weiland et al. |
| 5,675,287 A | 10/1997 | Baker et al. |
| 5,678,198 A | 10/1997 | Lemson |
| 5,699,383 A | 12/1997 | Ichiyoshi |
| 5,732,333 A | 3/1998 | Cox et al. |
| 5,740,520 A | 4/1998 | Cyze et al. |
| 5,748,683 A | 5/1998 | Smith et al. |
| 5,757,229 A | 5/1998 | Mitzlaff |
| 5,786,728 A | 7/1998 | Alinikula |
| 5,794,153 A | 8/1998 | Ariyavisitakul et al. |
| 5,810,888 A | 9/1998 | Fenn |
| 5,818,883 A | 10/1998 | Smith et al. |
| 5,831,479 A | 11/1998 | Effel et al. |
| 5,852,651 A | 12/1998 | Fischer et al. |
| 5,870,668 A | 2/1999 | Takano et al. |
| 5,880,863 A | 3/1999 | Rideout et al. |
| 5,898,338 A | 4/1999 | Proctor et al. |
| 5,920,808 A | 7/1999 | Jones et al. |
| 5,923,712 A | 7/1999 | Leyendecker et al. |
| 5,936,464 A | 8/1999 | Grondhal |
| 5,937,011 A | 8/1999 | Carney et al. |
| 5,949,283 A | 9/1999 | Proctor et al. |
| 5,959,499 A | 9/1999 | Khan et al. |
| 5,959,500 A | 9/1999 | Garrido |
| 5,963,549 A | 10/1999 | Perkins et al. |
| 5,973,011 A | 10/1999 | Noack et al. |
| 6,005,506 A | 12/1999 | Bazarjani et al. |
| 6,005,884 A | 12/1999 | Cook et al. |
| 6,014,366 A | 1/2000 | Ichiyoshi |
| 6,054,896 A | 4/2000 | Wright et al. |
| 6,055,418 A | 4/2000 | Harris et al. |
| 6,072,364 A | 6/2000 | Jeckeln et al. |
| 6,081,158 A | 6/2000 | Twitchell et al. |
| 6,091,941 A | 7/2000 | Moriyama et al. |
| 6,112,086 A | 8/2000 | Wala |
| 6,124,758 A | 9/2000 | Korte et al. |
| 6,141,390 A | 10/2000 | Cova |
| 6,166,601 A | 12/2000 | Shalom et al. |
| 6,208,698 B1 | 3/2001 | Marchesani et al. |
| 6,215,354 B1 | 4/2001 | Kolanek et al. |
| 6,236,267 B1 | 5/2001 | Anzil |
| 6,240,144 B1 | 5/2001 | Ha |
| 6,242,979 B1 | 6/2001 | Li |
| 6,246,286 B1 | 6/2001 | Persson |
| 6,246,865 B1 | 6/2001 | Lee |
| 6,252,912 B1 | 6/2001 | Salinger |
| 6,253,094 B1 | 6/2001 | Schmutz |
| 6,266,531 B1 | 7/2001 | Zadeh et al. |
| 6,275,685 B1 | 8/2001 | Wessel et al. |
| 6,288,610 B1 | 9/2001 | Miyashita |
| 6,301,579 B1 | 10/2001 | Becker |
| 6,313,703 B1 | 11/2001 | Wright et al. |
| 6,314,142 B1 | 11/2001 | Perthold et al. |
| 6,315,189 B1 | 11/2001 | Williams |
| 6,320,463 B1 | 11/2001 | Leva et al. |
| 6,351,189 B1 | 2/2002 | Hirvilampi |
| 6,353,600 B1 | 3/2002 | Schwartz et al. |
| 6,356,146 B1 | 3/2002 | Wright et al. |
| 6,356,369 B1 | 3/2002 | Farhan |
| 6,356,555 B1 | 3/2002 | Rakib et al. |
| 6,359,504 B1 | 3/2002 | Cozzarelli |
| 6,373,611 B1 | 4/2002 | Farhan et al. |
| 6,373,902 B1 | 4/2002 | Park et al. |
| 6,388,518 B1 | 5/2002 | Miyatani |
| 6,393,007 B1 | 5/2002 | Haartsen |
| 6,400,774 B1 | 6/2002 | Matsuoka et al. |
| 6,424,225 B1 | 7/2002 | Choi et al. |
| 6,430,402 B1 | 8/2002 | Agahi-Keshesh |
| 6,437,644 B1 | 8/2002 | Kenington |
| 6,445,688 B1 | 9/2002 | Garces et al. |
| 6,489,846 B2 | 12/2002 | Hatsugai |
| 6,493,335 B1 | 12/2002 | Darcie et al. |
| 6,512,417 B2 | 1/2003 | Booth et al. |
| 6,549,067 B1 | 4/2003 | Kenington |
| 6,552,609 B2 | 4/2003 | Hamada et al. |

(56) References Cited

U.S. PATENT DOCUMENTS

| | | | |
|---|---|---|---|
| 6,552,634 B1 | 4/2003 | Raab | |
| 6,566,944 B1 | 5/2003 | Pehlke et al. | |
| 6,587,514 B1 | 7/2003 | Wright et al. | |
| 6,591,090 B1 | 7/2003 | Lilja et al. | |
| 6,594,496 B2 | 7/2003 | Schwartz | |
| 6,600,406 B1 | 7/2003 | Ha | |
| 6,600,792 B2 | 7/2003 | Antonio et al. | |
| 6,614,854 B1 | 9/2003 | Chow et al. | |
| 6,625,429 B1 | 9/2003 | Yamashita | |
| 6,639,050 B1 | 10/2003 | Kieliszewski | |
| 6,639,463 B1 | 10/2003 | Ghanadan et al. | |
| 6,639,466 B2 | 10/2003 | Johnson | |
| 6,639,950 B1 | 10/2003 | Agerblom et al. | |
| 6,657,993 B1 | 12/2003 | Casanova et al. | |
| 6,677,870 B2 | 1/2004 | Im et al. | |
| 6,697,436 B1 | 2/2004 | Wright et al. | |
| 6,697,603 B1 | 2/2004 | Lovinggood et al. | |
| 6,703,897 B2 | 3/2004 | O'Flaherty et al. | |
| 6,704,545 B1 | 3/2004 | Wala | |
| 6,724,737 B1 | 4/2004 | Boyden et al. | |
| 6,741,662 B1 | 5/2004 | Francos et al. | |
| 6,741,663 B1 | 5/2004 | Tapio et al. | |
| 6,741,867 B1 | 5/2004 | Tetsuya | |
| 6,747,649 B1 | 6/2004 | Sanz-Pastor et al. | |
| 6,751,447 B1 | 6/2004 | Jin et al. | |
| 6,785,558 B1 | 8/2004 | Stratford et al. | |
| 6,794,931 B2 | 9/2004 | Kenington | |
| 6,801,767 B1 | 10/2004 | Schwartz et al. | |
| 6,804,540 B1 | 10/2004 | Shepherd et al. | |
| 6,826,164 B2 | 11/2004 | Mani et al. | |
| 6,831,901 B2 | 12/2004 | Millar | |
| 6,836,660 B1 | 12/2004 | Wala | |
| 6,885,241 B2 | 4/2005 | Huang et al. | |
| 6,898,252 B1 | 5/2005 | Yellin et al. | |
| 6,907,085 B2 | 6/2005 | Kubo et al. | |
| 6,963,242 B2 | 11/2005 | White et al. | |
| 6,963,552 B2 | 11/2005 | Sabat, Jr. et al. | |
| 6,973,139 B2 | 12/2005 | Ahn et al. | |
| 6,980,527 B1 | 12/2005 | Liu et al. | |
| 6,983,025 B2 | 1/2006 | Schell | |
| 6,985,704 B2 | 1/2006 | Yang et al. | |
| 6,998,909 B1 | 2/2006 | Mauer | |
| 7,023,273 B2 | 4/2006 | Johnson et al. | |
| 7,031,749 B1 | 4/2006 | Mitama | |
| 7,034,612 B2 | 4/2006 | Kim | |
| 7,035,345 B2 | 4/2006 | Jeckeln et al. | |
| 7,042,287 B2 | 5/2006 | Robinson | |
| 7,061,314 B2 | 6/2006 | Kwon et al. | |
| 7,064,606 B2 | 6/2006 | Louis | |
| 7,068,984 B2 | 6/2006 | Mathe et al. | |
| 7,071,777 B2 | 7/2006 | McBeath et al. | |
| 7,079,818 B2 | 7/2006 | Khorram | |
| 7,098,734 B2 | 8/2006 | Hongo et al. | |
| 7,102,442 B2 | 9/2006 | Anderson | |
| 7,103,329 B1 | 9/2006 | Thon | |
| 7,104,310 B2 | 9/2006 | Hunter | |
| 7,106,806 B1 | 9/2006 | Kenington | |
| 7,109,792 B2 | 9/2006 | Leffel | |
| 7,109,998 B2 | 9/2006 | Smith | |
| 7,123,890 B2 | 10/2006 | Kenington et al. | |
| 7,145,704 B1 | 12/2006 | Islam | |
| 7,151,913 B2 | 12/2006 | Ahmed | |
| 7,158,765 B2 | 1/2007 | Blair et al. | |
| 7,190,222 B2 | 3/2007 | Okazaki et al. | |
| 7,193,471 B2 | 3/2007 | Tsutsui et al. | |
| 7,193,472 B2 | 3/2007 | Gotou et al. | |
| 7,197,085 B1 | 3/2007 | Vella-Coleiro | |
| 7,248,642 B1 | 7/2007 | Vella-Coleiro | |
| 7,251,293 B2 | 7/2007 | Vella-Coleiro | |
| 7,257,328 B2 | 8/2007 | Levinson et al. | |
| 7,259,630 B2 | 8/2007 | Bachman et al. | |
| 7,283,519 B2 | 10/2007 | Girard | |
| 7,286,507 B1 | 10/2007 | Oh et al. | |
| 7,301,402 B2 | 11/2007 | Norris et al. | |
| 7,321,635 B2 | 1/2008 | Ocenasek et al. | |
| 7,321,636 B2 | 1/2008 | Harel et al. | |
| 7,333,559 B2 | 2/2008 | Song et al. | |
| 7,339,891 B2 | 3/2008 | Binder et al. | |
| 7,339,897 B2 | 3/2008 | Larsson et al. | |
| 7,362,776 B2 | 4/2008 | Meier et al. | |
| 7,372,918 B2 | 5/2008 | Muller et al. | |
| 7,409,007 B1 | 8/2008 | Johnson et al. | |
| 7,469,491 B2 | 12/2008 | McCallister et al. | |
| 7,489,632 B2 | 2/2009 | Lakkakorpi | |
| 7,493,094 B2 | 2/2009 | Ichitsubo et al. | |
| 7,496,367 B1 | 2/2009 | Ozturk et al. | |
| 7,555,266 B2 * | 6/2009 | Haardt | H04B 7/0615 455/114.2 |
| 7,593,710 B2 | 9/2009 | Brigaud et al. | |
| 7,603,141 B2 | 10/2009 | Dravida | |
| 7,610,460 B2 | 10/2009 | Watanabe et al. | |
| 7,634,536 B2 | 12/2009 | Halasz | |
| 7,639,982 B2 | 12/2009 | Wala | |
| 7,650,112 B2 | 1/2010 | Utsumi et al. | |
| 7,702,300 B1 | 4/2010 | McCune | |
| 7,765,294 B2 | 7/2010 | Edwards et al. | |
| 7,787,854 B2 | 8/2010 | Conyers et al. | |
| 7,801,038 B2 | 9/2010 | Liao et al. | |
| 7,826,369 B2 | 11/2010 | Filsfils et al. | |
| 7,826,810 B2 | 11/2010 | Carmel et al. | |
| 7,831,221 B2 | 11/2010 | Leffel et al. | |
| 7,848,747 B2 | 12/2010 | Wala | |
| 7,848,770 B2 | 12/2010 | Scheinert | |
| 7,855,977 B2 | 12/2010 | Morrison et al. | |
| RE42,287 E | 4/2011 | Apodaca et al. | |
| 8,010,099 B2 | 8/2011 | Ma et al. | |
| 8,010,116 B2 | 8/2011 | Scheinert | |
| 8,032,148 B2 | 10/2011 | Hettstedt et al. | |
| 8,036,226 B1 | 10/2011 | Ma et al. | |
| 8,064,850 B2 | 11/2011 | Yang et al. | |
| 8,098,572 B2 | 1/2012 | Zhou et al. | |
| 8,112,094 B1 | 2/2012 | Wellington | |
| 8,139,492 B1 | 3/2012 | Peterson et al. | |
| 8,149,950 B2 | 4/2012 | Kim et al. | |
| 8,213,401 B2 | 7/2012 | Fischer et al. | |
| 8,213,884 B2 | 7/2012 | Kim et al. | |
| 8,274,332 B2 | 9/2012 | Cho et al. | |
| 8,326,218 B2 | 12/2012 | Wala | |
| 8,326,238 B2 | 12/2012 | Yang et al. | |
| 8,346,091 B2 | 1/2013 | Kummetz et al. | |
| 8,346,160 B2 | 1/2013 | Kummetz | |
| 8,351,877 B2 | 1/2013 | Kim et al. | |
| 8,363,628 B2 | 1/2013 | Chi et al. | |
| 8,369,272 B2 | 2/2013 | Barbaresi et al. | |
| 8,380,143 B2 | 2/2013 | Yang et al. | |
| 8,401,499 B2 | 3/2013 | Kim et al. | |
| 8,446,530 B2 | 5/2013 | Bellers | |
| 8,451,735 B2 | 5/2013 | Li | |
| 8,472,897 B1 | 6/2013 | Yang | |
| 8,478,331 B1 | 7/2013 | Rogers et al. | |
| 8,509,347 B2 | 8/2013 | Kim et al. | |
| 8,520,603 B2 | 8/2013 | Kozisek et al. | |
| 8,527,003 B2 | 9/2013 | Gupta et al. | |
| 8,532,242 B2 | 9/2013 | Fischer et al. | |
| 8,542,768 B2 | 9/2013 | Kim et al. | |
| 8,548,403 B2 | 10/2013 | Kim et al. | |
| 8,548,526 B2 | 10/2013 | Schmidt et al. | |
| 8,577,286 B2 | 11/2013 | Wala | |
| 8,583,100 B2 | 11/2013 | Koziy et al. | |
| 8,620,234 B2 | 12/2013 | Yang et al. | |
| 8,681,917 B2 | 3/2014 | McAllister et al. | |
| 8,682,338 B2 | 3/2014 | Lemson et al. | |
| 8,730,786 B2 | 5/2014 | Wang et al. | |
| 8,731,495 B2 | 5/2014 | Yang et al. | |
| 8,737,300 B2 | 5/2014 | Stapleton et al. | |
| 8,737,454 B2 | 5/2014 | Wala et al. | |
| 8,804,870 B2 | 8/2014 | Kim et al. | |
| 8,811,917 B2 | 8/2014 | Kim et al. | |
| 8,842,649 B2 | 9/2014 | Liu et al. | |
| 8,848,766 B2 | 9/2014 | Lemson et al. | |
| 8,855,489 B2 | 10/2014 | Bold et al. | |
| 8,958,789 B2 | 2/2015 | Bauman et al. | |
| 9,026,067 B2 | 5/2015 | Stapleton et al. | |
| 9,031,521 B2 | 5/2015 | Yang et al. | |

(56) References Cited

U.S. PATENT DOCUMENTS

| | | |
|---|---|---|
| 9,054,758 B2 | 6/2015 | Yang et al. |
| 9,077,297 B2 | 7/2015 | Yang et al. |
| 9,137,078 B2 | 9/2015 | Stapleton et al. |
| 9,148,324 B2 | 9/2015 | Stapleton et al. |
| 9,374,196 B2 | 6/2016 | Yang et al. |
| 9,419,714 B2 | 8/2016 | Lemson et al. |
| 9,419,837 B2 | 8/2016 | Stapleton et al. |
| 9,531,473 B2 | 12/2016 | Lemson et al. |
| 9,742,446 B2 | 8/2017 | Yang et al. |
| 9,768,739 B2 | 9/2017 | Kim et al. |
| 9,820,171 B2 | 11/2017 | Lemson et al. |
| 9,826,508 B2 | 11/2017 | Lemson et al. |
| 10,045,314 B2 | 8/2018 | Stapleton et al. |
| 10,080,178 B2 | 9/2018 | Stapleton et al. |
| 10,097,142 B2 | 10/2018 | Yang et al. |
| 10,159,074 B2 | 12/2018 | Lemson et al. |
| 10,305,521 B2 | 5/2019 | Yang et al. |
| 10,334,499 B2 | 6/2019 | Stapleton et al. |
| 10,334,567 B2 | 6/2019 | Lemson et al. |
| 10,693,425 B2 | 6/2020 | Yang et al. |
| 11,159,129 B2 | 10/2021 | Yang et al. |
| 2001/0005402 A1 | 6/2001 | Nagatani et al. |
| 2001/0034223 A1 | 10/2001 | Rieser et al. |
| 2001/0051504 A1 | 12/2001 | Kubo et al. |
| 2002/0024398 A1 | 2/2002 | Lagerblom et al. |
| 2002/0025790 A1 | 2/2002 | Matsuoka |
| 2002/0034260 A1 | 3/2002 | Kim |
| 2002/0041208 A1 | 4/2002 | Hamada et al. |
| 2002/0041209 A1 | 4/2002 | Miyatani |
| 2002/0044014 A1 | 4/2002 | Wright et al. |
| 2002/0075906 A1 | 6/2002 | Cole et al. |
| 2002/0080891 A1 | 6/2002 | Ahn et al. |
| 2002/0086675 A1 | 7/2002 | Mansour |
| 2002/0093926 A1 | 7/2002 | Kilfoyle |
| 2002/0097085 A1 | 7/2002 | Stapelton |
| 2002/0101937 A1 | 8/2002 | Antonio et al. |
| 2002/0101938 A1 | 8/2002 | Horaguchi et al. |
| 2002/0158689 A1 | 10/2002 | Harris et al. |
| 2002/0179830 A1 | 12/2002 | Pearson et al. |
| 2002/0186436 A1 | 12/2002 | Mani et al. |
| 2002/0186783 A1 | 12/2002 | Opas et al. |
| 2002/0187761 A1 | 12/2002 | Im et al. |
| 2002/0187809 A1 | 12/2002 | Mani et al. |
| 2002/0191565 A1 | 12/2002 | Mani et al. |
| 2002/0191710 A1 | 12/2002 | Jeckeln et al. |
| 2002/0193085 A1 | 12/2002 | Mathe et al. |
| 2002/0193087 A1 | 12/2002 | Kim |
| 2003/0021263 A1 | 1/2003 | Lee |
| 2003/0021278 A1 | 1/2003 | Domschitz et al. |
| 2003/0035494 A1 | 2/2003 | Bauder et al. |
| 2003/0058959 A1 | 3/2003 | Rafie et al. |
| 2003/0095608 A1 | 5/2003 | Duperray |
| 2003/0098752 A1 | 5/2003 | Haghighat |
| 2003/0104792 A1 | 6/2003 | Doi |
| 2003/0112068 A1 | 6/2003 | Kenington |
| 2003/0137932 A1 | 7/2003 | Nishioka et al. |
| 2003/0143947 A1 | 7/2003 | Lyu |
| 2003/0146787 A1 | 8/2003 | Hedberg et al. |
| 2003/0179829 A1 | 9/2003 | Pinckley et al. |
| 2003/0179830 A1 | 9/2003 | Eidson et al. |
| 2003/0181221 A1 | 9/2003 | Nguyen |
| 2003/0207680 A1 | 11/2003 | Yang et al. |
| 2003/0227981 A1 | 12/2003 | Vella-Coleiro et al. |
| 2003/0228856 A1 | 12/2003 | Orihashi et al. |
| 2003/0234688 A1 | 12/2003 | Matsuyoshi et al. |
| 2004/0017859 A1 | 1/2004 | Sills et al. |
| 2004/0032912 A1 | 2/2004 | Ocenasek et al. |
| 2004/0053624 A1 | 3/2004 | Frank et al. |
| 2004/0096222 A1 | 5/2004 | Cagenius |
| 2004/0105509 A1 | 6/2004 | McGowan et al. |
| 2004/0136470 A1 | 7/2004 | DeBruyn et al. |
| 2004/0142667 A1 | 7/2004 | Lochhead et al. |
| 2004/0179587 A1 | 9/2004 | Kenington et al. |
| 2004/0180634 A1 | 9/2004 | Kenington et al. |
| 2004/0183672 A1 | 9/2004 | Krishan et al. |
| 2004/0203542 A1 | 10/2004 | Seo et al. |
| 2004/0208259 A1 | 10/2004 | Hunton |
| 2004/0212428 A1 | 10/2004 | Ode et al. |
| 2004/0240585 A1 | 12/2004 | Bishop et al. |
| 2004/0247042 A1 | 12/2004 | Sahlman |
| 2005/0008096 A1 | 1/2005 | Iwasaki et al. |
| 2005/0041968 A1 | 2/2005 | Takahashi |
| 2005/0059360 A1 | 3/2005 | Kenington |
| 2005/0068102 A1 | 3/2005 | Hongo et al. |
| 2005/0079834 A1 | 4/2005 | Maniwa et al. |
| 2005/0143091 A1 | 6/2005 | Shapira et al. |
| 2005/0152695 A1 | 7/2005 | Sulzberger et al. |
| 2005/0157675 A1 | 7/2005 | Feder et al. |
| 2005/0157814 A1 | 7/2005 | Cova et al. |
| 2005/0159117 A1 | 7/2005 | Bausov et al. |
| 2005/0164667 A1 | 7/2005 | Pan et al. |
| 2005/0174954 A1 | 8/2005 | Yun et al. |
| 2005/0180526 A1 | 8/2005 | Kim et al. |
| 2005/0180527 A1 | 8/2005 | Suzuki et al. |
| 2005/0181812 A1 | 8/2005 | Scheck |
| 2005/0190857 A1 | 9/2005 | Braithwaite |
| 2005/0195919 A1 | 9/2005 | Cova |
| 2005/0206564 A1 | 9/2005 | Mao et al. |
| 2005/0220066 A1 | 10/2005 | Wal et al. |
| 2005/0226346 A1 | 10/2005 | Ode et al. |
| 2005/0253652 A1 | 11/2005 | Song et al. |
| 2005/0258898 A1 | 11/2005 | Hongo |
| 2005/0262498 A1 | 11/2005 | Ferguson et al. |
| 2006/0012426 A1 | 1/2006 | Nezami |
| 2006/0012427 A1 | 1/2006 | Nezami |
| 2006/0141957 A1 | 1/2006 | Fischer et al. |
| 2006/0067426 A1 | 3/2006 | Maltsev et al. |
| 2006/0094470 A1 | 5/2006 | Wake et al. |
| 2006/0109052 A1 | 5/2006 | Saed et al. |
| 2006/0121858 A1 | 6/2006 | Tanaka et al. |
| 2006/0121944 A1 | 6/2006 | Buscaglia et al. |
| 2006/0214729 A1 | 9/2006 | Furuya et al. |
| 2006/0217083 A1 | 9/2006 | Braithwaite |
| 2006/0223468 A1 | 10/2006 | Toms et al. |
| 2006/0223572 A1 | 10/2006 | Hedin et al. |
| 2006/0223578 A1 | 10/2006 | Conyers et al. |
| 2006/0226903 A1 | 10/2006 | Muller et al. |
| 2006/0227736 A1 | 10/2006 | Conyers et al. |
| 2006/0233184 A1 | 10/2006 | Stanforth |
| 2006/0238245 A1 | 10/2006 | Carichner et al. |
| 2006/0239266 A1 | 10/2006 | Babbar et al. |
| 2006/0240786 A1 | 10/2006 | Liu |
| 2006/0262880 A1 | 11/2006 | Mizuta et al. |
| 2006/0270366 A1 | 11/2006 | Rozenblit et al. |
| 2006/0276147 A1 | 12/2006 | Suzuki et al. |
| 2007/0019598 A1 | 1/2007 | Prehofer |
| 2007/0019679 A1 | 1/2007 | Scheck et al. |
| 2007/0057737 A1 | 3/2007 | Davis et al. |
| 2007/0058742 A1 | 3/2007 | Demarco et al. |
| 2007/0064506 A1 | 3/2007 | Bauman et al. |
| 2007/0065078 A1 | 3/2007 | Jiang |
| 2007/0066234 A1 | 3/2007 | Lastinger et al. |
| 2007/0075780 A1 | 4/2007 | Krvavac et al. |
| 2007/0116046 A1 | 5/2007 | Liu et al. |
| 2007/0121543 A1 | 5/2007 | Kuchibhotla et al. |
| 2007/0135065 A1 | 6/2007 | Effel et al. |
| 2007/0147488 A1 | 6/2007 | Han |
| 2007/0160012 A1 | 7/2007 | Liu |
| 2007/0171234 A1 | 7/2007 | Crawfis et al. |
| 2007/0177552 A1 | 8/2007 | Wu et al. |
| 2007/0190952 A1 | 8/2007 | Waheed et al. |
| 2007/0223614 A1 | 9/2007 | Kuchibhotla et al. |
| 2007/0241812 A1 | 10/2007 | Yang et al. |
| 2007/0243899 A1 | 10/2007 | Hermel et al. |
| 2007/0253389 A1 | 11/2007 | Lucidarme et al. |
| 2007/0264947 A1 | 11/2007 | Rozenblit et al. |
| 2007/0273439 A1 | 11/2007 | Lin et al. |
| 2007/0274279 A1 | 11/2007 | Wood et al. |
| 2007/0281643 A1 | 12/2007 | Kawai |
| 2007/0296494 A1 | 12/2007 | Hongo |
| 2008/0031380 A1 | 2/2008 | Takabayashi |
| 2008/0045254 A1 | 2/2008 | Gupta et al. |
| 2008/0051129 A1 | 2/2008 | Abe et al. |
| 2008/0058018 A1 | 3/2008 | Scheinert |

(56) References Cited

U.S. PATENT DOCUMENTS

| | | |
|---|---|---|
| 2008/0068191 A1 | 3/2008 | Maeda et al. |
| 2008/0069032 A1 | 3/2008 | Liu |
| 2008/0070632 A1 | 3/2008 | Obuchi et al. |
| 2008/0089689 A1 | 4/2008 | Sakama |
| 2008/0094139 A1 | 4/2008 | Takano et al. |
| 2008/0107014 A1 | 5/2008 | Huang et al. |
| 2008/0119198 A1 | 5/2008 | Hettstedt et al. |
| 2008/0139140 A1 | 6/2008 | Matero et al. |
| 2008/0146146 A1 | 6/2008 | Binder et al. |
| 2008/0152037 A1 | 6/2008 | Kim et al. |
| 2008/0165882 A1 | 7/2008 | Hedayat et al. |
| 2008/0181182 A1 | 7/2008 | Carichner et al. |
| 2008/0181282 A1 | 7/2008 | Wala et al. |
| 2008/0199183 A1 | 8/2008 | Liu et al. |
| 2008/0225816 A1 | 9/2008 | Osterling et al. |
| 2008/0240036 A1 | 10/2008 | Liu et al. |
| 2008/0240286 A1 | 10/2008 | Zhang et al. |
| 2008/0265996 A1 | 10/2008 | Kim et al. |
| 2009/0003196 A1 | 1/2009 | Capece et al. |
| 2009/0013317 A1 | 1/2009 | Abfalter et al. |
| 2009/0019664 A1 | 1/2009 | Abram |
| 2009/0029664 A1 | 1/2009 | Batruni |
| 2009/0046586 A1 | 2/2009 | Stuart et al. |
| 2009/0060088 A1 | 3/2009 | Callard et al. |
| 2009/0060496 A1 | 3/2009 | Liu et al. |
| 2009/0061771 A1 | 3/2009 | Ma et al. |
| 2009/0082010 A1 | 3/2009 | Lee et al. |
| 2009/0088093 A1 | 4/2009 | Nentwig |
| 2009/0146736 A1 | 6/2009 | Kim et al. |
| 2009/0146870 A1 | 6/2009 | Thome et al. |
| 2009/0153898 A1 | 6/2009 | Sato |
| 2009/0154621 A1 | 6/2009 | Shapira et al. |
| 2009/0170543 A1 | 7/2009 | Mostafa et al. |
| 2009/0180407 A1 | 7/2009 | Sabat et al. |
| 2009/0180426 A1 | 7/2009 | Sabat et al. |
| 2009/0180462 A1 | 7/2009 | Duerdodt et al. |
| 2009/0191891 A1 | 7/2009 | Ma et al. |
| 2009/0213972 A1 | 8/2009 | Maunuksela et al. |
| 2009/0238566 A1 | 9/2009 | Boldi et al. |
| 2009/0247092 A1 | 10/2009 | Beaudin et al. |
| 2009/0252094 A1 | 10/2009 | Chang et al. |
| 2009/0252136 A1 | 10/2009 | Mahany et al. |
| 2009/0252139 A1 | 10/2009 | Ludovico et al. |
| 2009/0274048 A1 | 11/2009 | Sambhwani et al. |
| 2009/0274085 A1 | 11/2009 | Wang et al. |
| 2009/0286484 A1 | 11/2009 | Phung et al. |
| 2010/0002661 A1 | 1/2010 | Schmidt et al. |
| 2010/0008669 A1 | 1/2010 | Rhy et al. |
| 2010/0067906 A1 | 3/2010 | Adhikari et al. |
| 2010/0075678 A1 | 3/2010 | Akman et al. |
| 2010/0087227 A1 | 4/2010 | Francos et al. |
| 2010/0112981 A1 | 5/2010 | Suh et al. |
| 2010/0118921 A1 | 5/2010 | Abdelmonem et al. |
| 2010/0128676 A1 | 5/2010 | Wu et al. |
| 2010/0130130 A1 | 5/2010 | Liu |
| 2010/0136932 A1 | 6/2010 | Osterling et al. |
| 2010/0136998 A1 | 6/2010 | Lott et al. |
| 2010/0142417 A1* | 6/2010 | Kim .............. H04B 7/15557 370/281 |
| 2010/0157901 A1 | 6/2010 | Sanderovitz et al. |
| 2010/0176885 A1 | 7/2010 | Kim et al. |
| 2010/0177759 A1 | 7/2010 | Fischer et al. |
| 2010/0177760 A1 | 7/2010 | Cannon et al. |
| 2010/0178936 A1 | 7/2010 | Wala et al. |
| 2010/0182984 A1 | 7/2010 | Herscovici et al. |
| 2010/0202565 A1 | 8/2010 | Abbasfar |
| 2010/0210267 A1 | 8/2010 | Bae et al. |
| 2010/0238904 A1 | 9/2010 | Zhang et al. |
| 2010/0247105 A1 | 9/2010 | Yu |
| 2010/0261504 A1 | 10/2010 | Lukkarila |
| 2010/0265842 A1 | 10/2010 | Khandekar et al. |
| 2010/0265874 A1 | 10/2010 | Palanki et al. |
| 2010/0266287 A1 | 10/2010 | Adhikari et al. |
| 2010/0271957 A1 | 10/2010 | Stapleton et al. |
| 2010/0271985 A1 | 10/2010 | Gabriel et al. |
| 2010/0278530 A1 | 11/2010 | Kummetz et al. |
| 2010/0279704 A1 | 11/2010 | Vachhani |
| 2010/0291949 A1 | 11/2010 | Shapira et al. |
| 2010/0296816 A1 | 11/2010 | Larsen |
| 2010/0299173 A1 | 11/2010 | Zampiello et al. |
| 2010/0304773 A1 | 12/2010 | Ramprashad |
| 2010/0311372 A1 | 12/2010 | Bouyaud et al. |
| 2010/0315978 A1 | 12/2010 | Satapathy et al. |
| 2010/0324814 A1 | 12/2010 | Wu et al. |
| 2011/0009056 A1 | 1/2011 | Hanson et al. |
| 2011/0026417 A1* | 2/2011 | Kishiyama .......... H04W 52/225 370/252 |
| 2011/0065438 A1 | 3/2011 | Bergman et al. |
| 2011/0069657 A1 | 3/2011 | Gholmieh et al. |
| 2011/0103309 A1 | 5/2011 | Wang et al. |
| 2011/0135013 A1 | 6/2011 | Wegener |
| 2011/0135308 A1 | 6/2011 | Tarlazzi et al. |
| 2011/0156815 A1 | 6/2011 | Kim et al. |
| 2011/0158081 A1 | 6/2011 | Wang et al. |
| 2011/0158116 A1 | 6/2011 | Tenny et al. |
| 2011/0195673 A1 | 8/2011 | Pratt et al. |
| 2011/0223958 A1 | 9/2011 | Chen et al. |
| 2011/0237178 A1 | 9/2011 | Seki et al. |
| 2011/0241425 A1 | 10/2011 | Hunter, Jr. et al. |
| 2011/0249708 A1 | 10/2011 | Maca |
| 2011/0255434 A1 | 10/2011 | Ylitalo |
| 2011/0281579 A1 | 11/2011 | Kummetz |
| 2011/0287791 A1 | 11/2011 | Fujishima et al. |
| 2011/0300870 A1 | 12/2011 | Chun et al. |
| 2011/0302390 A1 | 12/2011 | Copeland et al. |
| 2011/0310810 A1 | 12/2011 | Kenington et al. |
| 2011/0310881 A1 | 12/2011 | Kenington |
| 2012/0002586 A1 | 1/2012 | Gainey et al. |
| 2012/0002967 A1 | 1/2012 | Mayer et al. |
| 2012/0039254 A1 | 2/2012 | Stapleton et al. |
| 2012/0057572 A1 | 3/2012 | Evans et al. |
| 2012/0127938 A1 | 5/2012 | Lv et al. |
| 2012/0147993 A1 | 6/2012 | Kim et al. |
| 2012/0150521 A1 | 6/2012 | Balkwill |
| 2012/0154038 A1 | 6/2012 | Kim et al. |
| 2012/0155572 A1 | 6/2012 | Kim et al. |
| 2012/0206885 A1 | 8/2012 | Pan et al. |
| 2012/0230382 A1 | 9/2012 | Kim et al. |
| 2012/0281565 A1 | 11/2012 | Sauer |
| 2013/0095870 A1 | 4/2013 | Phillips et al. |
| 2013/0153298 A1 | 6/2013 | Pietraski et al. |
| 2013/0214861 A1 | 8/2013 | Kim et al. |
| 2013/0272202 A1 | 10/2013 | Stapleton et al. |
| 2013/0315291 A1 | 11/2013 | Kim et al. |
| 2014/0126914 A1 | 5/2014 | Berlin et al. |
| 2014/0286247 A1 | 9/2014 | Lemson et al. |
| 2014/0313884 A1 | 10/2014 | Stapleton et al. |
| 2014/0327481 A1 | 11/2014 | Km et al. |
| 2015/0092830 A1 | 4/2015 | Kim et al. |
| 2015/0244430 A1 | 8/2015 | Shattil |
| 2016/0014782 A1 | 1/2016 | Stapleton et al. |
| 2016/0080082 A1 | 3/2016 | Lemson et al. |
| 2016/0269210 A1 | 9/2016 | Kim et al. |
| 2017/0033969 A1 | 2/2017 | Yang et al. |
| 2017/0055198 A1 | 2/2017 | Stapleton et al. |
| 2017/0070897 A1 | 3/2017 | Lemson et al. |
| 2017/0181008 A1 | 6/2017 | Fischer |
| 2017/0214420 A1 | 7/2017 | Phillips et al. |
| 2017/0238318 A1 | 8/2017 | Lemson et al. |
| 2018/0102747 A1 | 4/2018 | Kim et al. |
| 2018/0279197 A1 | 9/2018 | Kim et al. |
| 2019/0208523 A1 | 7/2019 | Lemson et al. |
| 2019/0288900 A1 | 9/2019 | Yang et al. |
| 2020/0083914 A1 | 3/2020 | Yang et al. |
| 2020/0092787 A1 | 3/2020 | Stapleton et al. |
| 2020/0136567 A1 | 4/2020 | Kim et al. |
| 2020/0146015 A1 | 5/2020 | Lemson et al. |
| 2020/0169937 A1 | 5/2020 | Kim et al. |
| 2020/0267732 A1 | 8/2020 | Lemson et al. |

FOREIGN PATENT DOCUMENTS

| | | |
|---|---|---|
| CN | 1640086 A | 7/2005 |
| CN | 1652520 A | 8/2005 |

(56) References Cited

FOREIGN PATENT DOCUMENTS

| | | |
|---|---|---|
| CN | 1774094 A | 5/2006 |
| CN | 1969463 A | 5/2007 |
| CN | 100341292 C | 10/2007 |
| CN | 100426897 C | 10/2008 |
| CN | 201127027 Y | 10/2008 |
| CN | 101394647 A | 3/2009 |
| CN | 101433124 A | 5/2009 |
| CN | 101453699 A | 6/2009 |
| CN | 101453799 A | 6/2009 |
| CN | 101521893 A | 9/2009 |
| CN | 101523969 A | 9/2009 |
| CN | 201307942 Y | 9/2009 |
| CN | 100574122 C | 12/2009 |
| CN | 101621806 A | 1/2010 |
| CN | 101754229 A | 6/2010 |
| CN | 101754431 A | 6/2010 |
| CN | 102460385 A | 5/2012 |
| CN | 103201958 A | 7/2013 |
| EP | 0368673 A1 | 5/1990 |
| EP | 0642243 A1 | 3/1995 |
| EP | 1227605 A2 | 7/2002 |
| EP | 1 566 979 A1 | 8/2005 |
| EP | 1118234 B1 | 2/2006 |
| EP | 1713290 A1 | 10/2006 |
| EP | 1 750 376 A1 | 2/2007 |
| EP | 1924109 A1 | 5/2008 |
| EP | 2 430 531 A1 | 3/2012 |
| EP | 2606576 | 6/2013 |
| IN | 8527/CHENP/2011 A | 3/2013 |
| JP | 1992-207532 A | 7/1992 |
| JP | 1993-136724 A | 1/1993 |
| JP | H09-284149 A | 10/1997 |
| JP | 2000-092412 A | 3/2000 |
| JP | 2000-512107 A | 9/2000 |
| JP | 2000-278237 A | 10/2000 |
| JP | 2001-508954 A | 7/2001 |
| JP | 2001-217885 A | 8/2001 |
| JP | 2001-244757 A | 9/2001 |
| JP | 2001-268032 A | 9/2001 |
| JP | 2002-158615 A | 5/2002 |
| JP | 2002-516511 A | 6/2002 |
| JP | 2002-536902 A | 10/2002 |
| JP | 2004-015364 A | 1/2004 |
| JP | 2004-147009 A2 | 5/2004 |
| JP | 2004-153800 A | 5/2004 |
| JP | 2005-020675 A | 1/2005 |
| JP | 2005-150932 A | 6/2005 |
| JP | 2006-340166 A | 12/2006 |
| JP | 2007-006163 A | 1/2007 |
| JP | 2007-507957 A | 3/2007 |
| JP | 2007-104018 A | 4/2007 |
| JP | 2007-195056 A | 8/2007 |
| JP | 2007-523577 A | 8/2007 |
| JP | 2007-235738 A | 9/2007 |
| JP | 2007-529926 A | 10/2007 |
| JP | 2008-506322 A | 2/2008 |
| JP | 2008-099137 A2 | 4/2008 |
| JP | 2008-516503 A | 5/2008 |
| JP | 2008-135955 A | 6/2008 |
| JP | 2009-038688 A | 2/2009 |
| JP | 2009-147956 A | 7/2009 |
| JP | 2009-296335 A2 | 12/2009 |
| JP | 2010-509816 A | 3/2010 |
| JP | 2010-166531 A2 | 7/2010 |
| JP | 2010-541297 A | 12/2010 |
| JP | 2012-525093 A | 10/2012 |
| JP | 2018-064298 A | 4/2018 |
| KR | 10-1996-0702978 A | 5/1996 |
| KR | 1996-7002978 A1 | 5/1996 |
| KR | 2000-0039780 A | 7/2000 |
| KR | 10-2000-0016621 U | 9/2000 |
| KR | 10-2004-0054420 A | 6/2004 |
| KR | 10-2005-0006725 A | 1/2005 |
| KR | 10-2005-0052556 A | 6/2005 |
| KR | 2009-0088083 A | 8/2009 |
| KR | 10-2010-017270 A | 2/2010 |
| KR | 10-2010-0107065 A | 10/2010 |
| KR | 10-2014-0026321 A1 | 3/2014 |
| KR | 101874655 B1 | 7/2018 |
| TW | 261419 B | 9/2006 |
| WO | 94/28690 A1 | 12/1994 |
| WO | 97/48181 A1 | 12/1997 |
| WO | 98/24256 A2 | 6/1998 |
| WO | 99/60715 A1 | 11/1999 |
| WO | 00/19750 A1 | 4/2000 |
| WO | 00/23956 A1 | 4/2000 |
| WO | 00/46916 A1 | 8/2000 |
| WO | 01/56197 A2 | 8/2001 |
| WO | 02/23956 A2 | 3/2002 |
| WO | 02/47414 A2 | 6/2002 |
| WO | 02/48862 A1 | 6/2002 |
| WO | 02/056481 A2 | 7/2002 |
| WO | 02/102102 A1 | 12/2002 |
| WO | 2005/034544 A1 | 4/2005 |
| WO | 2005/076495 A1 | 8/2005 |
| WO | 2006/040653 A1 | 4/2006 |
| WO | 2007/127543 A2 | 11/2007 |
| WO | 2008/036976 A2 | 3/2008 |
| WO | 2008/061701 A1 | 5/2008 |
| WO | 2008/105775 A1 | 9/2008 |
| WO | 2008/146394 A1 | 12/2008 |
| WO | 2008/154077 A1 | 12/2008 |
| WO | 2008/155610 A2 | 12/2008 |
| WO | 2009/097237 A1 | 8/2009 |
| WO | 2009/151893 A2 | 12/2009 |
| WO | 2010/008794 A2 | 1/2010 |
| WO | 2010/083115 A2 | 7/2010 |
| WO | 2010/087031 A1 | 8/2010 |
| WO | 2010/124297 A1 | 10/2010 |
| WO | 2010133942 A1 | 11/2010 |
| WO | 2012/024343 A1 | 2/2012 |
| WO | 2012/024345 A2 | 2/2012 |
| WO | 2012/024349 A1 | 2/2012 |

OTHER PUBLICATIONS

Bicsi, "Network Design Basics for Cabling Professionals", McGraw-Hill, New York, NY, USA, 2002, 393 pages.
Common Public Radio Interface (CPRI) Specification V1.4, dated Mar. 31, 2006, downloaded from http://www.cpri.info/spec.html on Mar. 28, 2017, 64 pages.
Common Public Radio Interface (CPRI) Specification V2.1, dated Mar. 31, 2006, downloaded from http://www.cpri.info/spec.html on Mar. 28, 2017, 76 pages.
Common Public Radio Interface (CPRI) Specification V3.0, dated Oct. 20, 2006, downloaded from http://www.cpri.info/spec.html on Mar. 28, 2017, 89 pages.
"Common Public Radio Interface (CPRI) Specification V4.0", dated Jun. 30, 2008, downloaded from http://www.cpri.info/spec.html on Mar. 28, 2017, 96 pages.
"Common Public Radio Interface (CPRI) Specification V4.1", dated Feb. 18, 2009, downloaded from http://www.cpri.info/spec.html on Mar. 28, 2017, 109 pages.
Grundmann et al., "An empriacal comparison of a distrubuted antenna microcell system versus a single antenna microcell system for indooor spread spectrum communications at 1.8 GHz", ICUPC Conference, 1993, 5 pages.
Zhaohui et al., "A rake type receiver structure for CDMA mobile communication systems using antenna arrays", IEEE, 1996, pp. 528-530.
Mastering The Mix In Signal Processing, Mixed-Signal Design Seminar, 1991, Analog Devices, Inc., 3 pages.
Grace, Martin K., "Synchronous quantized subcarrier multiplexing for transport of video, voice, and data", IEEE Journal on Selected Areas in Communications, vol. 8, No. 7, Sep. 1990, pp. 1351-1358.
Wala, Philip M., "A new microcell architecture using digital optical transport", 1993, IEEE, pp. 585-588.
Crofut, Walter, "Remote monitoring of wirelss base stations Jun. 1, 1998", http://urgentcomm.com/prinUmag/remote-monitoring-wireless-base-stations, downloaded on Mar. 13, 2017, 4 pages.

(56) References Cited

OTHER PUBLICATIONS

Cyr et al., "The digital age is here, Digital radio frequency transport enhances cellular network performance", Jul. 4, 1993, Telephony, pp. 20-24.
CityCell 824, "Remote Site Manual, How to use it, Preliminary Version", Feb. 1, 1993, 237 pages.
Cheun, Kyungwhoon, "Performance of direct-sequence spread-spectrum rake receives with randon spreading sequences", IEEE Transactions On Communication, vol. 45, No. 9, Sep. 9, 1997, pp. 1130-1143.
Brunner et al., "On space-time rake receiver structure for WCDMA", 1999, IEEE, pp. 1546-1551.
Graf, Rudolf F., "Modern Dictionary of Electronics, 7th Ed.", Newnes publishing, 1999, 9 pages.
Introduction to Receivers Available at http://weww.ece.ucsb.edu/long/ece145a/Introduction_to_Receivers.pdf downloaded Jun. 15, 2017, 28 pages.
Pereira, Stephen M., "Standardizing Digital IF Data Transfer with VITA 49", RTC Magazine, downloaded Jun. 15, 2017 from http://rtcmagazine.com/articles/view/100460, 5 pages.
Lan et al., "GSM Co-Channel and Adjacent Channel Interference Analysis and Optimization", Tsinghua Science And Technology, ISSN 1007-0214 04/12, vol. 16, No. 6, Dec. 2011, pp. 583-588.
Acampora, Anthony, "Declaration of Dr. Anthony Acampora" in support of Inter Partes Review of U.S. Pat. No. 9,531,473, Feb. 2, 2018, 190 pages.
Laplante, Phillip A., "Comprehensive Dictionary of Electrical Engineering", IEEE Press, CRC Press LLC, 1999, 4 pages.
"Computer Dictionary. The Comprehensive Standard for Business, School, Library and Home", 1991, Microsoft Press, ISBN 1-55615-231-0, 6 pages.
Wiley Electrical and Electronics Engineering Dictionary, 2004, Wiley & Sons, Inc., 7 pages.
"McGraw-Hill Dictionary of Scientific and Technical Terms", (5th ed.), 1994, McGraw-Hill, Inc., ISBN 0-07-042333-4, 6 pages.
Excerpts from Patent Owner's Invalidity Contentions regarding U.S. Pat. No. 7,639,982 served in related matter *CommScope Technologies LLC v. Dali Wireless, Inc.*, Case No. 3:16-cv-00477-B (N.D. Tex.) ("Patent Owner's Invalidity Contentions Ex. C"), Feb. 2, 2018, 410 pages.
Horak, Ray, "Telecommunications and Data Communications Handbook", Wiley & Sons, Inc., 2007, 55 pages.
Spurgeon, Charles E., "Ethernet, The Definitive Guide", 2000, O'reilly & Assoc., Inc., 112 pages.
"Dali Wireless, Inc.'s claim construction brief", in: *CommScope Technologies LLC v. Dali Wireless, Inc.*, Case No. 3:16-cv-00477-B (N.D. Tex.), Jun. 30, 2017, 36 pages.
"Dali Wireless, Inc.'s responsive claim construction brief", in: *CommScope Technologies LLC v. Dali Wireless, Inc.*, Case No. 3:16-cv-00477-B (N.D. Tex.), Aug. 18, 2017, 30 pages.
ADC Digivance "Street-Level Coverage Solution (SCS)", Aug. 2005, 8 pages.
ADC Digivance "Street-Level Coverage Solution System with Version 3.01 EMS Software Operation and Maintenance Manual", ADCP-75-187, Issue 1, Sep. 2005, 78 pages.
ADC Digivance "CXD Multi-Band Distributed Antenna System Installation and Operation Manual", ADCP-75-192; Preliminary Issue D; Oct. 2005, 122 pages.
ADC Digivance "Street-Level Coverage Solution 800 MHz, 1900 MHz, and 800/900 MHz SMR System Operation and Maintenance Manual" ADCP-75-187, Preliminary Issue 1B, Nov. 2005, 88 pages.
ADC Digivance "CXD Multi-Band Distributed Antenna System Operation Manual", ADCP-75-192, Issue 1, Dec. 2005, 130 pages.
ADC Digivance "Indoor Coverage Solution 800 MHz Single- or Multi-Mode Fiber System Installation and Operation Manual", ADC-75-130, Preliminary Issue 3C, Aug. 2006, 78 pages.
ADC Digivance "NXD Radio Access Node (RAN) Installation and Maintenance Manual", ADCP-75-210, Issue 1, Nov. 2006, 84 pages.
ADC "ADC FlexWave Prism Element Management System 6.0", User Manual, ADCP-77-152, Issue 1, Mar. 2010, 308 pages.
ADC "ADC FlexWave Prism Element Management System 7.1", User Manual, ADCP-77-177, Issue 1, Jul. 2011, 350 pages.
ADC "ADC FlexWave Prism 6.0", Troubleshooting Guide, ADCP-77-074, Issue 1, Oct. 2010, 62 pages.
ADC "ADC FlexWave Prism Remote RF Module", Installation Instructions, ADCP-77-079, Issue 2, Mar. 2010, 30 pages.
ADC "ADC FlexWave Prism Remote RF Module", Installation Instructions, ADCP-77-079, Issue 3, Jul. 2011, 32 pages.
ADC "ADC FlexWave Prism Remote 40W RF Module", Installation Instructions, ADCP-77-162, Issue 1, Mar. 2010, 26 pages.
ADC "ADC FlexWave Prism Remote Unit", Installation Guide, ADCP-77-072, Issue 4, Jul. 2011, 44 pages.
ADC "ADC FlexWave Prism Remote Unit", Installation Guide, ADCP-77-072, Issue 5, Nov. 2011, 44 pages.
ADC "FlexWave Prism Flexible Outdoor Wireless Coverage Capacity", 106969AE, Oct. 2008, 8 pages.
ADC "ADC FlexWave Prism Host, Remote and EMS 5.1", System Reference, ADCP-77-073, Issue 2, Nov. 2009, 364 pages.
ADC "FlexWave URH Operation and Maintenance Manual—Preliminary", 2007, 7 pages.
ADC "ADC FlexWave Universal Radio Head (URH) Remote Unit Installation Instructions", ADCP-75-34 7, Issue 1, Apr. 2008, 32 pages.
ADC "ADC FlexWave Universal Radio Head (URH) Host Unit Installation Instructions", ADCP-75-348, Issue 1, Apr. 2008, 44 pages.
ADC FlexWave User Manual, "FlexWave Web-Based Element Management System for Universal Radio Head System", Version 2/Version 3, ADCP-75-352, Issue 1, Aug. 2008, 160 pages.
Das et al., "A dynamic load balancing strategy for channel assignment using selective borrowing in cellular mobile environment", Wireless Networks, vol. 3, 1997, pp. 333-347.
ETSI TS 125 101 V.3.11.0 "Universal Mobile Telecommunications System (UMTS); UE Radio Transmission and Reception (FDD) (3GPP TS 25.101 Version 3.11.0 Release 1999", Jun. 2002, 69 pages.
ETSI TS 125 423 V5.6.0 "Universal Mobile Telecommunications System (UMTS); UTRAN lur Interface Radio Network Subsystem Application Part (RNSAP) Signaling (3GPP TS 25.423 version 5.6.0 Release 5)", Jun. 2003, 559 pages.
Hollis et al., "The Theory of Digital Down Conversion", Hunt Engineering, Jun. 26, 2003, 6 pages.
Information Sciences Institute, University of Southern California, "DOD Standard Internet Protocol", RFC 760, Jan. 1980, 46 pages.
Information Sciences Institute, University of Southern California, "Internet Protocol; DARPA Internet Program; Protocol Specification", RFC 791, Sep. 1981, 49 pages.
Obsai "Open Base Station Architecture Initiative: BTS System Reference Document", Version 2.0; Apr. 27, 2006, 151 pages.
Obsai "Open Base Station Architecture Initiative: Reference Point 3 Specification" Version 3.1, Nov. 13, 2006, 116 pages.
Obsai "Open Base Station Architecture Initiative: Reference Point 3 Specification", Version 4.1, Jul. 14, 2008, pp. 1-144.
Parker, Sybil P. "McGraw-Hill Dictionary of Science and Technical Terms: 5th Edition" McGraw-Hill, Inc. 1994; 6 pages.
Armstrong, J. Abstract for "Peak-to-Average Power Reduction for OFDM by Repeated Clipping and Frequency Domain Filtering" IEEE Electronics Letters, vol. 38, Issue 5, Feb. 2002, pp. 246-247.
Bernardini et al., "Analysis of Different Optimization Criteria for IF Predistortion in Digital Radio Links With Nonlinear Amplifiers", IEEE Trans. On Communications, vol. 45, No. 4, Apr. 1997, pp. 421-428.
Cavers, James K., "Adaptive Behavior of a Feedforward Amplifier Linearizer", IEEE Trans. On Vehicular Technology, vol. 44, No. 1, Feb. 1995, pp. 31-40.
Cavers, James K., "Amplifier Linearization Using a Digital Predistorter With Fast Adaptation and Low Memory Requirements", IEEE Trans. On Vehicular Technology, vol. 39, No. 4, Nov. 1990, pp. 374-382.

(56) References Cited

OTHER PUBLICATIONS

Ding et al., "A Hammerstein Predistortion Linearization Design Based on The Indirect Learning Architecture", IEEE Int'l Conf. on Acoustics, Speech, and Signal Processing, vol. 3, 2002, pp. 2689-2692.

Ding, Lei, "Digital Predistortion of Power Amplifiers for Wireless Applications", School of Electrical and Computer Engineering Georgia Institute of Technology, Mar. 2004, 117 pages.

Eun et al., "A New Volterra Predistorter Based on the Indirect Learning Architecture", IEEE Transactions on Signal Processing, vol. 45, No. 1, Jan. 1997, pp. 223-227.

Faulkner et al., "Adaptive Linearization Using Predistortion - Experimental Results", IEEE Trans. On Vehicular Technology, vol. 43, No. 2, May 1994, pp. 323-332.

Hilborn et al., "An Adaptive Direct Conversion Transmitter", IEEE Transactions on Vehicular Technology, vol. 43, No. 2, May 1994, pp. 223-233.

Kim et al., "Baseband Derived RF Digital Predistortion", Electronic Letters, Vo. 42, No. 8, Apr. 13, 2006, pp. 6-7.

Kim, Wan-Jong, "Digital Predistortion Linearization and Crest Factor Reduction for Wideband Applications", 2006, 124 bages.

Kim et al., "Digital Predistortion Linearizes Wireless Power Amplifiers", IEEE Microwave Magazine, vol. 6, Issue 3, Sep. 2005, 8 pages.

Kim et al., Abstract for "Digital Predistortion of a Doherty Amplifier With a Weak Memory within a Connected Solution" IEEE 60th Vehicular Technology Conference, vol. 3, Oct. 2004, 6 pages.

Kim et al., "Piecewise Pre-Equalized Linearization of the Wireless Transmitter with a Doherty Amplifier", IEEE Transactions on Microwave Theory and Techniques; vol. 54, No. 9, Sep. 2006, pp. 3469-3478.

Leung et al., Abstract For "Algorithm for Repeated Clipping and Filtering in Peak-to-Average Power Reduction for OFDM", IEEE Electronic Letters, vol. 38, Issue 25, Dec. 5, 2002, 2 pages.

Nagata, Yoshinori, "Linear Amplification Technique For Digital Mobile Communications", In Proc. 39th IEEE Vehicular Technology Conference, San Francisco, CA, May 1989, pp. 159-165.

Santella, Giovanni, "Performance of Adaptive Predistorters in Presence of Orthogonal Multicarrier Modulation", International Conference on Telecommunications, Melbourne, Australia, Apr. 2-5, 1997, pp. 621-626.

Stapleton et al., "An Adaptive Predistorter for a Power Amplifier Based on Adjacent Channel Emissions", IEEE Transactions on Vehicular Technology; vol. 41, Issue 1, Feb. 1992, pp. 49-56.

Vaananen et al., "Effect of Clipping in Wideband CDMA System and Simple Algorithm for Peak Windowing", World Wireless Congress, San Francisco, May 2002, 7 pages.

Yang et al., Abstract for "A Fully Matched N-Way Doherty Amplifier with Optimized Linearity" IEEE Trans. Microwave Theory Tech., vol. 51, No. 3, Mar. 2003, 3 pages.

Mekechuk et al., "Linearizing Power Amplifiers Using Digital Predistortion, EDA tools and Test Hardware", High Frequency Electronics, Apr. 2004, pp. 18-24.

Notice of Allowance received for U.S. Appl. No. 16/901,116, dated Jun. 23, 2021, 56 pages.

Notice of Allowance received for U.S. Appl. No. 16/406,252, dated Aug. 5, 2021, 7 pages.

Notice of Allowance received for U.S. Appl. No. 16/592,615, dated Sep. 23, 2021, 7 pages.

Non Final Office Action received for U.S. Appl. No. 17/234,482, dated Sep. 15, 2021, 55 pages.

Notice of Allowance received for U.S. Appl. No. 16/737,419 dated Nov. 29, 2021, 7 pages.

Notice of Allowance received for U.S. Appl. No. 16/406,252, dated Dec. 2, 2021, 82 pages.

Notice of Allowance received for U.S. Appl. No. 16/737,419, dated Feb. 15, 2022, 15 pages.

Notice of Allowance received for U.S. Appl. No. 16/592,615, dated Apr. 1, 2022, 50 pages.

Final Office Action received for U.S. Appl. No. 17/234,482, dated Mar. 30, 2022, 8 pages.

Non Final Office Action received for U.S. Appl. No. 17/322,503, dated Jun. 7, 2022, 43 pages.

Non Final Office Action received for U.S. Appl. No. 17/322,503, dated Jul. 13, 2022, 4 pages.

Non Final Office Action received for U.S. Appl. No. 17/510,249, dated Jul. 8, 2022, 88 pages.

Non Final Office Action received for U.S. Appl. No. 17/713,937, dated Jul. 6, 2022, 17 pages.

Non Final Office Action received for U.S. Appl. No. 17/713,937, dated Jul. 13, 2022, 16 pages.

Non Final Office Action received for U.S. Appl. No. 17/479,951, dated Sep. 15, 2022, 75 pages.

Notice of Allowance received for U.S. Appl. No. 17/713,937, dated Dec. 1, 2022, 94 pages.

Non Final Office Action received for U.S. Appl. No. 17/845,870, dated Oct. 14, 2022, 5 pages.

Non Final Office Action received for U.S. Appl. No. 17/713,094, dated Mar. 8, 2023, 8 pages.

Notice of Allowance received for U.S. Appl. No. 17/713,937, dated Mar. 9, 2023, 9 pages.

\* cited by examiner

DISTRIBUTED ANTENNA SYSTEM

CROSS-REFERENCES TO RELATED APPLICATIONS

The present application a continuation of Ser. No. 16/410,860, filed May 13, 2019; which is a continuation of U.S. patent application Ser. No. 16/059,434, filed Aug. 9, 2018, now U.S. Pat. No. 10,334,499; which is a continuation of U.S. patent application Ser. No. 15/223,819, filed Jul. 29, 2016, now U.S. Pat. No. 10,080,178; which is a continuation of U.S. patent application Ser. No. 14/800,515, filed Jul. 15, 2015, now U.S. Pat. No. 9,419,837; which is a continuation of U.S. patent application Ser. No. 14/260,145, filed Apr. 23, 2014, now U.S. Pat. No. 9,137,078; which is a continuation of U.S. patent application Ser. No. 13/211,247, filed Aug. 16, 2011, now U.S. Pat. No. 8,737,300; which claims the benefit of U.S. Provisional Patent Application No. 61/439,940, filed Feb. 7, 2011, the disclosures of which are hereby incorporated by reference for all purposes.

FIELD OF THE INVENTION

The present invention generally relates to wireless communication systems employing Distributed Antenna Systems (DAS) as part of a distributed wireless network. More specifically, the present invention relates to a DAS utilizing one or more remotely monitored and controlled digital access units configured to assign particular packet transmissions to selected ones of a plurality of remote units, which can in some embodiments be configured in a daisy-chained rings.

BACKGROUND OF THE INVENTION

Wireless and mobile network operators face the continuing challenge of building networks that effectively manage high data-traffic growth rates. Mobility and an increased level of multimedia content for end users requires end-to-end network adaptations that support both new services and the increased demand for broadband and flat-rate Internet access. One of the most difficult challenges faced by network operators is maximizing the capacity of their DAS networks while ensuring cost-effective DAS deployments and at the same time providing a very high degree of DAS remote unit availability.

In order to provide DAS network capacity which is high enough to meet short-term needs of network subscribers in specific locations yet also avoid costly and inefficient deployment of radio resources, DAS network planners prefer to employ DAS architectures and solutions which provide a high degree of dynamic flexibility. Therefore, it would be advantageous for wireless network operators to employ a DAS solution which has a high degree of flexibility to implement dynamic rearrangements based on ever-changing network conditions and subscriber needs. Also, the more future-proof a DAS deployment can be, generally the lower its life cycle cost.

DAS network planners and system integrators employ a wide range of innovative approaches for helping to ensure that a particular DAS deployment is as cost-effective as possible. The types of costs considered by network planners and integrators include DAS deployment or DAS installation cost, as well as operational costs including maintenance costs, emergency restoration costs and network re-arrangement costs. Rearrangement costs are particularly significant for indoor DAS applications, due to frequent changes in building use and facility needs changes. Therefore, it would be advantageous to employ DAS systems and methods which are based on as few DAS transport facilities as possible to minimize installation and/or lease costs and have self-healing capabilities to avoid the need for costly emergency restoration services.

In order to obtain a high degree of DAS remote unit availability, two primary conditions must be satisfied. First, the DAS remote unit itself must be inherently reliable. Second, the transport media e.g., optical fiber, must be very reliable. It is well known that electronic and/or optical connections themselves are a significant root cause of failure or reduced availability in a DAS network. Companies who maintain outdoor DAS networks have reported that a failure of outside plant optical fiber facilities is not as rare as would be desirable. Therefore, it would be advantageous to employ systems and methods which offer higher redundancy and/or self-healing features in the event of failure of a transport media connection.

SUMMARY OF THE INVENTION

The present invention substantially achieves the advantages and benefits discussed above and overcomes the limitations of the prior art discussed above by providing a distributed antenna system responsive to one or more base stations and having at least one but in some embodiments a plurality of Digital Access Units ("DAU's"), each operating to control the packet traffic of an associated plurality of Digital Remote Units ("DRU's"). In embodiments employing multiple DAU's, the DAU's can be daisy-chained linearly or in a ring configuration. Likewise, depending upon the implementation, the DRU's associated with a given DAU can be configured in either a linear or ring Daisy chain configuration.

The data received from the base stations is down-converted, digitized and converted to baseband with the DAU. The data streams are then I/Q mapped and framed and independently serialized, such that multiple data streams are available in parallel from the DAU. In at least some embodiments, the DAU communicates with the associated DRU's via an optical transport arrangement. It will be appreciated by those skilled in the art that, using the present invention, it is possible to configure a distributed antenna system having n base stations, each providing m RF outputs for transmission by one or more associated DAU's to o DRU's, where the only limits are imposed by the technical performance specifications of the particular DAS, such as delay.

By the use of a ring configuration for connecting, in at least some embodiments, the DRU's and/or the DAU's, fault tolerance is built into the system, with resulting high availability. In single DAU embodiments, each DRU is accessible through two paths, and therefore remains available even in the event of a line break. In multi-DAU embodiments, where the DAU's are linearly daisy-chained, each DRU is accessible from multiple DRU's such that even some DAU failures will not prevent system operation. In embodiments employing a ring connection for the DAU's, multiple paths exist to each DAU, and thus provide an additional level of fault tolerance as well as dynamic load balancing and resource management as discussed in greater detail hereinafter.

Thus, the configuration of the advanced system architecture of the present invention provides a high degree of flexibility to manage, control, enhance and facilitate the radio resource efficiency, usage, availability, and overall performance of the distributed wireless network. The present invention enables specialized applications and enhancements including Flexible Simulcast, automatic traffic load-balancing, network and radio resource optimization, network calibration, autonomous/assisted commissioning, carrier pooling, automatic frequency selection, radio frequency carrier placement, traffic monitoring, traffic tagging, and indoor location determination using pilot beacons. The present invention can also serve multiple operators, multi-mode radios (modulation-independent) and multi-frequency bands per operator to increase the efficiency and traffic capacity of the operators' wireless networks.

Further the present invention provides a high degree of dynamic flexibility, supports dynamic re-arrangements, and provides a low life cycle cost. This advanced system architecture enables deployment of DAS networks using fewer DAS transport facilities to reduce costs, while providing self-healing features. The present invention also offers redundancy and enhanced system availability.

It is an object of the present invention to provide Flexible Simulcast capabilities, as disclosed in U.S. Provisional Application Ser. No. 61/382,836, entitled "Remotely Reconfigurable Distributed Antenna System and Methods," filed Sep. 14, 2010, incorporated herein by reference, in a high-availability ring configuration using, for example, optical fiber transport. As discussed above, the ring configuration insures that a break in any optical fiber cable will not shut down the daisy-chained network, because the downlink and uplink signals can be rerouted around the cable break to the respective DRUs.

It is a further object of the present invention to balance the bidirectional data rate on the optical fibers so as to increase the maximum achievable data rate during operation on the ring network of DRUs.

It is a further object of the present invention to provide higher transport network capacity in the event the data transport is asymmetrical between the downlink and uplink, as is typically the case for mobile broadband networks.

It is a further object of the present invention to provide an adaptive and automatic control for optimizing the transport media capacity on the ring.

It is a further object of the present invention to provide a method of summing co-channel users' uplink signals in the DRU daisy chain.

Applications of the present invention are suitable to be employed with distributed base stations, distributed antenna systems, distributed repeaters, mobile equipment and wireless terminals, portable wireless devices, and other wireless communication systems such as microwave and satellite communications. The present invention is also field upgradable through a link such as an Ethernet connection to a remote computing center.

Appendix I is a glossary of terms used herein, including acronyms.

BRIEF DESCRIPTION OF THE DRAWINGS

Further objects and advantages of the present invention can be more fully understood from the following detailed description taken in conjunction with the accompanying drawings in which:

FIG. 4 provides an example of a daisy chain ring network.

DETAILED DESCRIPTION OF THE INVENTION

Figure 1:
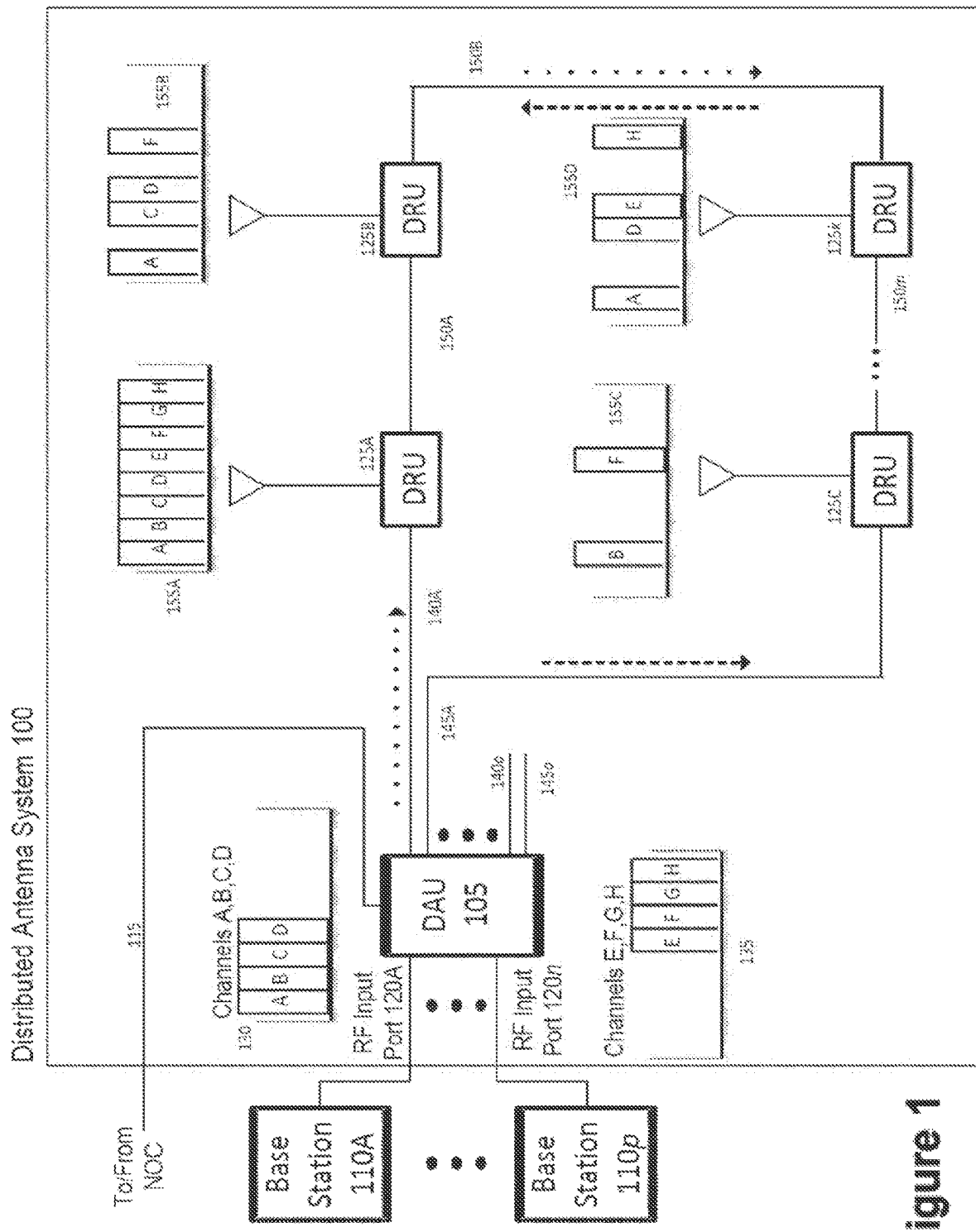
FIG. 1 is a block diagram according to one embodiment of the invention showing the basic structure and an example of a unidirectional, channelized downlink transport, one ring scenario based on having one DAU and four DRUs.

The present invention is a novel Reconfigurable Distributed Antenna System that provides a high degree of flexibility to manage, control, re-configure, enhance and facilitate the radio resource efficiency, usage and overall performance of the distributed wireless network. FIG. 1 illustrates an embodiment of the Distributed Antenna System 100 that provides an example of a unidirectional, channelized downlink transport in accordance with the present invention. In FIGS. 1-4, a dotted line denotes a distinct subset of uplink and downlink channels identified as "A." A dashed line denotes a distinct subset of uplink and downlink channels identified as "B." The subset of uplink and downlink channels in A do not include those of B and vice versa. The system employs a Digital Access Unit functionality 105 (hereinafter "DAU"). The DAU 105 serves as an interface between associated base stations (BTS) 110A-B and a plurality of digital remote units (DRU) 125A-n, although only four DRU's are shown in FIG. 1. In the present description, "DRU" will be used interchangeably with Remote Radio Head Unit, or "RRU", because of the similarity of the functions discussed herein, although those skilled in the art will recognize that a DRU communicates with a DAU, whereas an RRU communicates with a base station. In addition, those skilled in the art will recognize that a DAU is monitored and controlled by a remote network operations center ("NOC"), as indicated at bidirectional link 115 in FIG. 1. Such links are typically Ethernet connections or external modems, but can be any form of link suitable for remote monitoring and control. The NOC has the capability to remotely configure the DAU parameter settings which in turn configures the DRU's parameter settings. The NOC can request information from the DAUs. The DAUs can subsequently request information from the DRUs. The information requested includes but is not limited to uplink power, downlink power, optical error rate, gain settings, active carriers, etc.

For the downlink (DL) path, RF input signals 120A through 120n are received at the DAU 105 from one or more base station units (BTS) indicated at 110A through 11 Op. The RF input signals are separately down-converted, digitized, and converted to baseband (using a Digital Down-Converter) by the DAU. Data streams are then I/Q mapped and framed and specific parallel data streams are then independently serialized and translated to optical signals using pluggable SFP modules, again by the DAU 105. The independently serialized, parallel data streams are then delivered to different DRU's 125A-125k, typically over optical fiber cable arranged, in at least some embodiments, in a ring configuration indicated at connection pairs 140A-145A, or, in other embodiments, a daisy chain configuration. In addition, each DAU can support a plurality of rings with associated DRU's, where the additional rings are indicated by fiber optic pairs up through 140o-145o. It will be appreciated by those skilled in the art that the number of RF inputs, DAU's and DRU's and rings is limited only by network performance factors, such as delay. In addition, as discussed in connection with FIG. 4 herein, the DAS can be further extended by using a ring or daisy-chain of DAU's, each of which supports an arrangement of DRU's and rings as shown in FIG. 1.

One function of the DAU 105 is to determine the direction in which downlinked channels are propagated around the ring. As just one example, the embodiment shown in FIG. 1 is configured to have downlink channels A, B, C and D propagate in a first direction, for example clockwise, and channels E, F, G, and H propagate in the counter direction, although it will be understood that the number of channels propagating in each direction need not be equal, nor adjacent, nor sequential. Likewise, the number of channels received at each DRU is assigned by the DAU and need not be equal, adjacent or sequential, but instead will typically be any configuration that optimizes network utilization.

Figure 2:
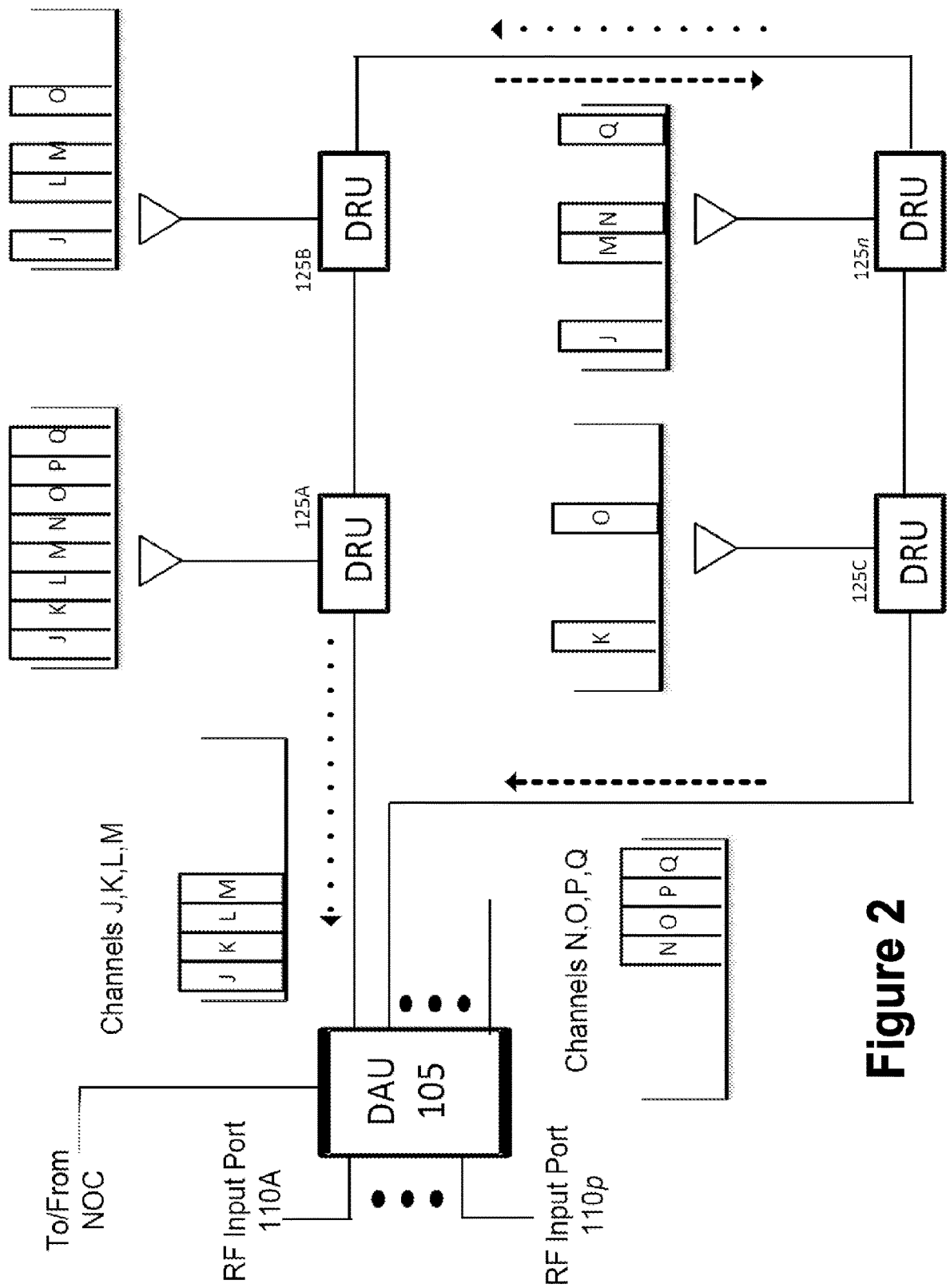
FIG. 2 is a block diagram in accordance with an embodiment of the invention showing the basic structure and an example of a unidirectional, channelized uplink transport, one ring scenario based on having one DAU and four DRUs.

Referring next to FIG. 2, an embodiment of an uplink (UL) path in accordance with the invention can be better appreciated. Channels received at the antenna associated with each DRU are converted into optical signals by each DRU 125A-125k. Optical signals received from the DRU's are de-serialized and de-framed by the DAU 105, and are also up-converted digitally using a Digital Up-Converter implemented within the DAU 105. Each data stream is then independently converted to the analog domain and up-converted to the appropriate RF frequency band, still within the DAU 105 in the illustrated implementation, although this functionality can be separate. The RF signals are then delivered to the appropriate one of a plurality of BTS' 110A-110p. As with the arrangement shown in FIG. 1, the direction of propagation of each channel is controlled by the DAU, with some channels propagating in a clockwise direction and others in a counterclockwise direction. Also as discussed in connection with FIG. 1, while adjacent channels are shown as propagating in the same direction in FIG. 2, this is not required and any channel can be selected to propagate in either direction.

Referring again to FIG. 1, it will be appreciated by those skilled in the art that, in some implementations of a DAS, more than one carrier can exist in each channel, and, as such, a DRU may receive a channel comprising a signal containing two or more carriers, or a wireless operator may have more than one RF carrier per channel allocated to a single base station. This is referred to as a "composite signal". The manner in which a composite downlink signal is managed by the present invention can be better understood with reference to FIG. 1. In such instances, the DAU will receive a composite downlink input signal 130 from, e.g., a first base station 110A belonging to one wireless operator, enters the DAU 105 at the RF input port 120A. Composite signal 130 comprises carriers A-D. A second composite downlink input signal from e.g., a pth base station 110p belonging to the same wireless operator enters DAM at the DAU1 RF input port 120n. Composite signal 135 comprises carriers E-H. The functionality of the DAU 105, and DRU's 125A-125k, respectively, are explained in detail in U.S. Provisional Application Ser. No. 61/374,593, entitled "Neutral Host Architecture for a Distributed Antenna System," filed Aug. 17, 2010, the disclosure of which is hereby incorporated by reference in its entirety for all purposes.

One optical output of DAU 105 is fed to DRU 125A, via bidirectional optical cable 140A. A second optical output of DAU 105 is fed via bidirectional optical cable 145A to DRU3. Similarly, bidirectional optical cables 150, 155 and 160 connect DRU's 125A-n in a ring configuration, such that DRU 125A connects to DRU 125B via cable 150A, DRU 125B connects to DRU 125n via cable 15013, and DRU 125k connects to DRU 125C, or the kth-1 DRU, via cable 150m. This connection facilitates networking of DAU 105, which means that all of Carriers A-H are available within DAU 105 to transport data to DRU's 125A-k depending on software settings within the networked DAU system. Depending upon the embodiment, the software settings within DRU 125A are configured either manually or automatically, such that carriers A-H are present in the downlink output signal 155A at the antenna port of DRU 125A. The presence of all eight carriers means that DRU 125A is potentially able to access the full capacity of both base stations feeding DAU 105. A possible application for DRU125A is a cafeteria in an enterprise building during the lunch hour where a large number of wireless subscribers are gathered.

DRU 125B is fed by a second optical port of DRU 125A via bidirectional optical cable 150A. The optical cable 150A performs the function of daisy chaining DRU 125A with DRU12513. As with DRU 125A, the software settings within DRU 125B are configured either manually or automatically such that Carriers A, C, D and F are present in downlink output signal 155E at the antenna port of DRU 1258. The capacity of DRU 125B is set to a much lower value than DRU 125A by virtue of its specific channel settings as controlled by DAU 105. The individual Digital Remote Units have integrated frequency selective DUCs and DDCs with gain control for each carrier. The DAU's can remotely turn on and off the individual carriers via the gain control parameters.

In a similar manner as described previously for DRU 125A, the software settings within DRU 125C are configured either manually or automatically such that Carriers B and F are present in downlink output signal 155C at the antenna port of DRU 125C. Compared to the downlink signal 155B at the antenna port of DRU 12513, the capacity of DRU 125C, which is also configured via its software settings, is much less than the capacity of DRU 125B. DRU 125n is fed by the optical cable 150m connected to the second optical port of the $n^{th}$-1 DRU, shown for simplicity in FIG. 1 as DRU 125C. The software settings within DRU 125n are configured either manually or automatically such that carriers A, D, E and H are present in downlink output signal 155D at the antenna port of DRU 125n. Typically, the capacity of DRU 125n is set to a much lower value than DRU 125A, however, the relative capacity settings of each of DRU's 125A-n can be adjusted dynamically to meet the capacity needs within the coverage zones determined by the physical positions of antennas connected to those DRU's. As noted above, the ring connection is completed by interconnecting DRU 125B and DRU 125n through optical cable 150B. The ring configuration insures that any optical cable breaks will not shut down the daisy chained network. The downlink and uplink signals will be rerouted around the cable break to the respective DRUs.

The present invention facilitates conversion and transport of several discrete relatively narrow RF bandwidths. This approach allows conversion of only those multiple specific relatively narrow bandwidths which carry useful or specific information. This approach also allows more efficient use of the available optical fiber transport bandwidth for neutral host applications, and allows transport of more individual operators' band segments over the optical fiber. As disclosed in U.S. Provisional Application Ser. No. 61/374,593, entitled "Neutral Host Architecture for a Distributed Antenna System," filed Aug. 17, 2010 together with U.S. Provisional Application Ser. No. 61/382,836, entitled "Remotely Reconfigurable Distributed Antenna System and Methods", filed Sep. 14, 2010, both assigned to the assignee of the present invention, and also referring to FIG. 1 of the instant patent application, Digital Up Converters located within the DRU can be dynamically reconfigured as the result of commands from the NOC to transport from the DAU input to any specific DRU output any specific narrow frequency band or bands, RF carriers or RF channels which are available at the respective RF input port of either DAU. This capability is illustrated in FIG. 1 where only specific frequency bands or RF carriers appear at the output of a given DRU. More specifically, through commands received from the NOC, the FPGA's in the DAU and one or more of the associated DRU's can be reprogrammed or reconfigured to convert and transport only the desired narrow bandwidths.

A related capability of the present invention is that not only can the Digital Up Converters located within each DRU be configured to transport any specific narrow frequency band from the DAU input to any specific DRU output, but also the Digital Up Converters within each DRU can be configured to transport any specific time slot or time slots of each carrier from the DAU input to any specific DRU output. The carriers and time slots are monitored by the DAU by filtering the signals and performing power detection of the individual time slots, which information can be conveyed to the NOC as desired. Then, as with the Digital Up Converters, the Field Programmable Gate Arrays (FPGA) in the DAU or DRU can be dynamically reconfigured by commands received from the NOC in a manner analogous to software programmability. The DAU detects which carriers and corresponding time slots are active. This information is relayed to the individual DRUs via the management control and monitoring protocol software. This information is then used, as appropriate, by the DRUs for turning off and on individual carriers and their corresponding time slots.

Data transport between the Base Station and the subscribers is typically asymmetrical, whereby the downlink data rate is higher than the uplink rate. The ring network configuration of Daisy Chained DRUs can exploit this data rate asymmetry to maximize the data transport on the optical fibers 150A-150m.

The present invention balances the bidirectional data rate on the optical fibers so as to increase the maximum achievable data rate on the ring network of DRUs. The individual downlink channels are transmitted in a unidirectional sense along the ring network. Referring to FIG. 1, downlink channels A, B, C, and D are transmitted in a clockwise sense around the ring of DRU's 125A-k. On the other hand, downlink channels E, F, G and H are transmitted in a counterclockwise sense around the ring of DRUs. Referring to FIG. 2, the uplink channels J, K, L and M are transmitted in a counterclockwise sense whereas uplink channels N, O, P and Q are transmitted in a clockwise sense around the ring of DRUs. If the downlink and uplink data rates were the same, there would be no advantage in the transport mechanism. However, if the data transport is asymmetrical between the downlink and uplink then a significant advantage can be gained. For example, for a factor of two difference between the downlink and uplink data rates, a 4/3 factor increase in data transport can be achieved. The larger the asymmetry between the downlink and uplink data rates, the larger will be the increase in data transport using the unidirectional channel transport mechanism around the ring.

Referring again to FIG. 1, a further embodiment in accordance with another aspect of the present invention may be better understood. In the event that there is a significant change in asymmetry between the downlink and uplink data rates and/or if there is a change in channel complement at the BTS, the Management Control module [discussed in connection with FIG. 7 herein] which is typically comprised within each DAU is able to automatically and adaptively re-allocate data transport resources on the clockwise direction of the ring and on the counterclockwise direction of the ring to maximize the overall transport capacity. As stated previously, the larger the degree of asymmetry between uplink and downlink data rates for a particular DAU, the higher the increase in data transport using the unidirectional channel transport mechanism around the ring. If there is more than one DAU present, in an embodiment one DAU is designated a Master DAU by the NOC, and the Management Control module located in the Master DAU makes decisions to optimize the overall transport capacity. In the event the master DAU fails, the NOC can designate another DAU as master. Alternatively, any suitable failover algorithm can be implemented.

Figure 3:
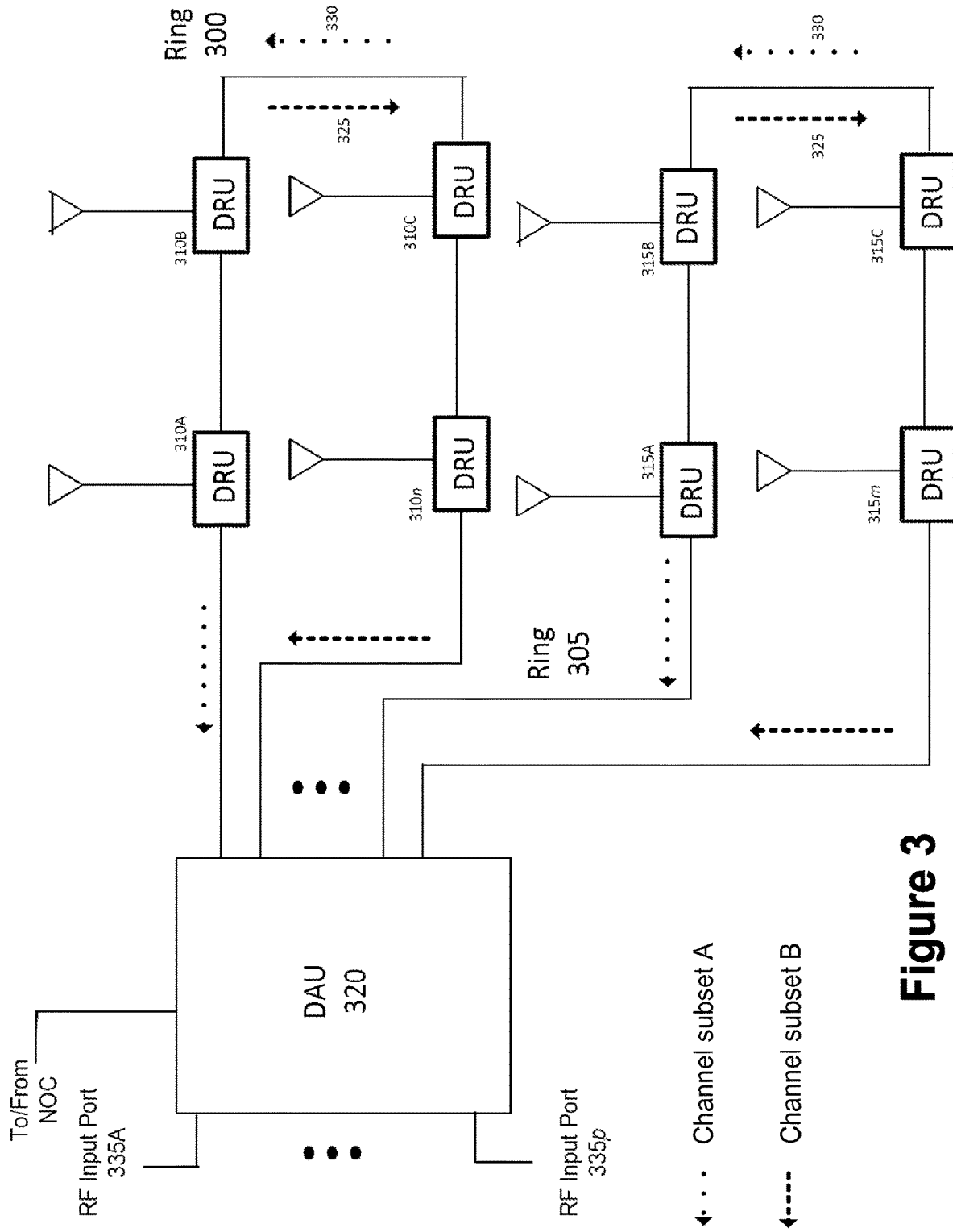
FIG. 3 is a block diagram in accordance with an embodiment of the invention showing the basic structure and an example of a unidirectional, channelized uplink transport, two ring scenario based on having one DAU and eight DRUs.

Referring to FIG. 3, an alternative embodiment of the present invention wherein a single DAU controls a plurality of rings, each comprising a plurality of daisy-chained DRU's, can be better understood. In FIG. 3, two daisy-chained rings, indicated at 300 and 305, are shown although the number of rings could be greater and is determined mainly as a matter of design preference up to limits imposed by network performance. The rings each link a plurality of DRU's 310A-n and 315A-m, to a single DAU 320. The directional flow of the data transport is shown as the dashed lines 325 and dotted lines 330. The downlink channels available from the plurality of DRU's are divided into two subsets which flow in opposite directions around the two daisy-chained rings. The uplink channels are transported in a similar fashion. The channels are grouped into the two subsets so as to maximize the data transport to and from the DRUs. The DAU in turn communicates with one or more BTS's via RF Ports 335A p.

Heuristic algorithms may be used to allocate RF channel data in a Dual-ring DAS. For FIG. 3, there are two fibre rings R1, R2 (clockwise and counter clockwise) and a set T of $n \geq 2$ independent RF channels Ki, $1 \leq i \leq n$ (including uplink and downlink). A channel Ki requires a bandwidth of b(Ki) to transport on a fibre ring. A time-bounded algorithm exists which obtains a schedule having the optimal bandwidth allocation (i.e. the maximum aggregate bandwidth of each ring is as small as possible). A large number of advanced heuristic algorithms have been developed to solve such scheduling optimization problems. Some examples are genetic algorithm, evolutionary algorithm, greedy search, Tabu search, harmony search, simulated annealing, ant colony optimization, etc. For purposes of simplicity and clarity, a simple heuristic algorithm for two rings is described here, although the number of rings is not limited to two.

The algorithm begins by sorting the channels Ki decreasingly by bandwidth b(Ki). Then it schedules the channel in such a way that each channel is assigned to the ring which has the smaller aggregate bandwidth. The formal description of the algorithm follows.

Input: T=set of n independent channels Ki with required bandwidth b(Ki), $1 \leq i \leq n$.

Output: $L_1$, $L_2$ and $D_1$, $D_2$. Lj is the set of channels schedule on ring Rj, and $D_j$ is the maximum aggregate bandwidth of ring Rj, $Dj=Dj=(\Sigma b(J), J \epsilon L_j)$, $1 \leq j \leq 2$.

Algorithm (T, L, D)

Step 1 (initialize Ki and $D_1$, $D_2$) Sort Ki such that $b(Ki) \leq b(Ki_{+1})$, $1 \leq i \leq n-1$. $D_1 \leftarrow 0$, $D_2 \leftarrow 0$.

Step 2 (Schedule a channel)

For i=1 to n, step 1 do

If $D_1 \leq D_2$, then [assign Ki onto $L_1$, $D_1 \leftarrow D_1+b(Ki)$].

else [assign Ki onto $L_2$, $D_2 \leftarrow D_2+b(Ki)$].

Figure 4:
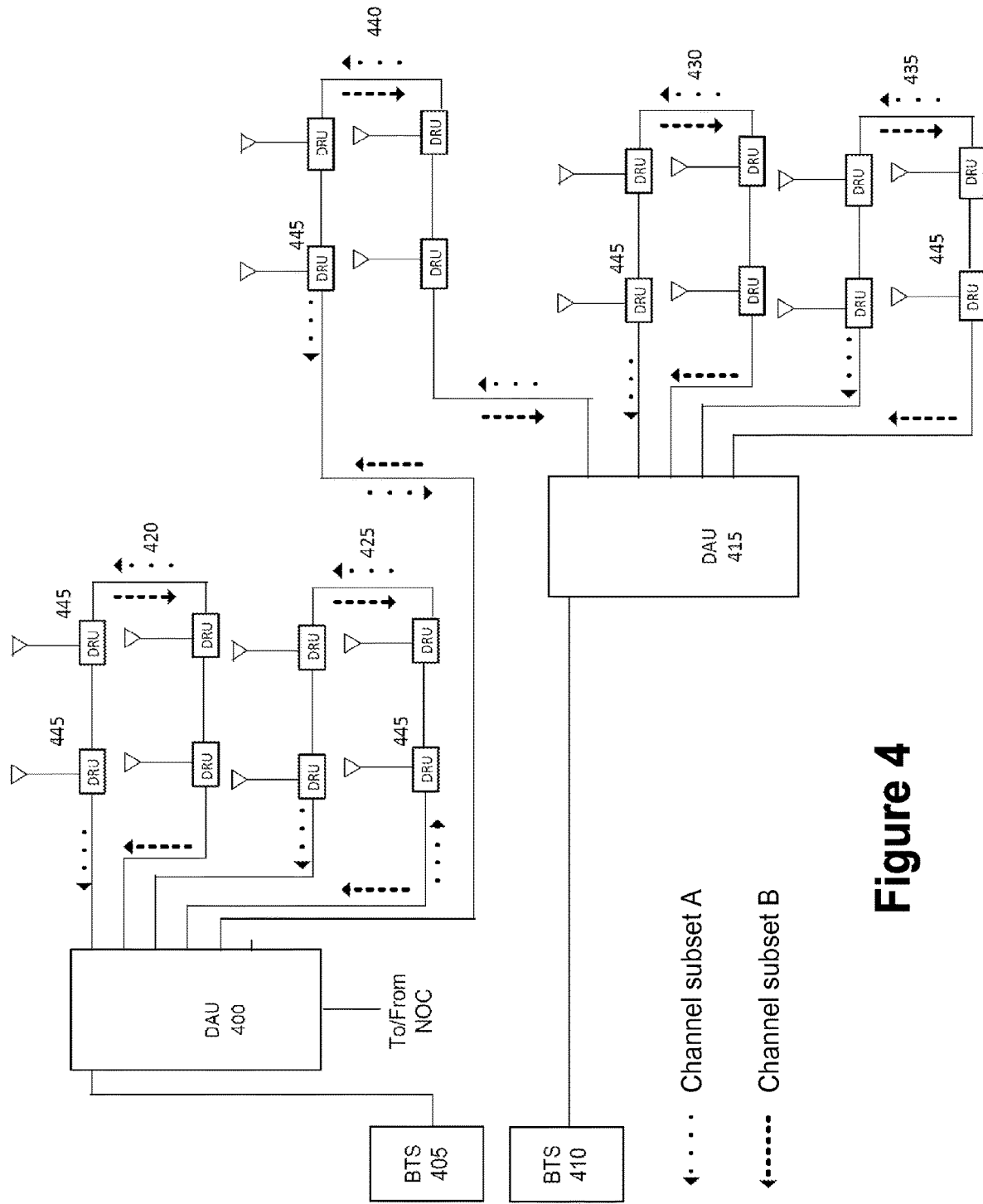
FIG. 4 is a block diagram in accordance with an embodiment of the invention showing the basic structure and an example of a unidirectional channelized uplink or downlink transport. This example of a five ring scenario comprises two DAUs and twenty DRUs.
Figure 8:
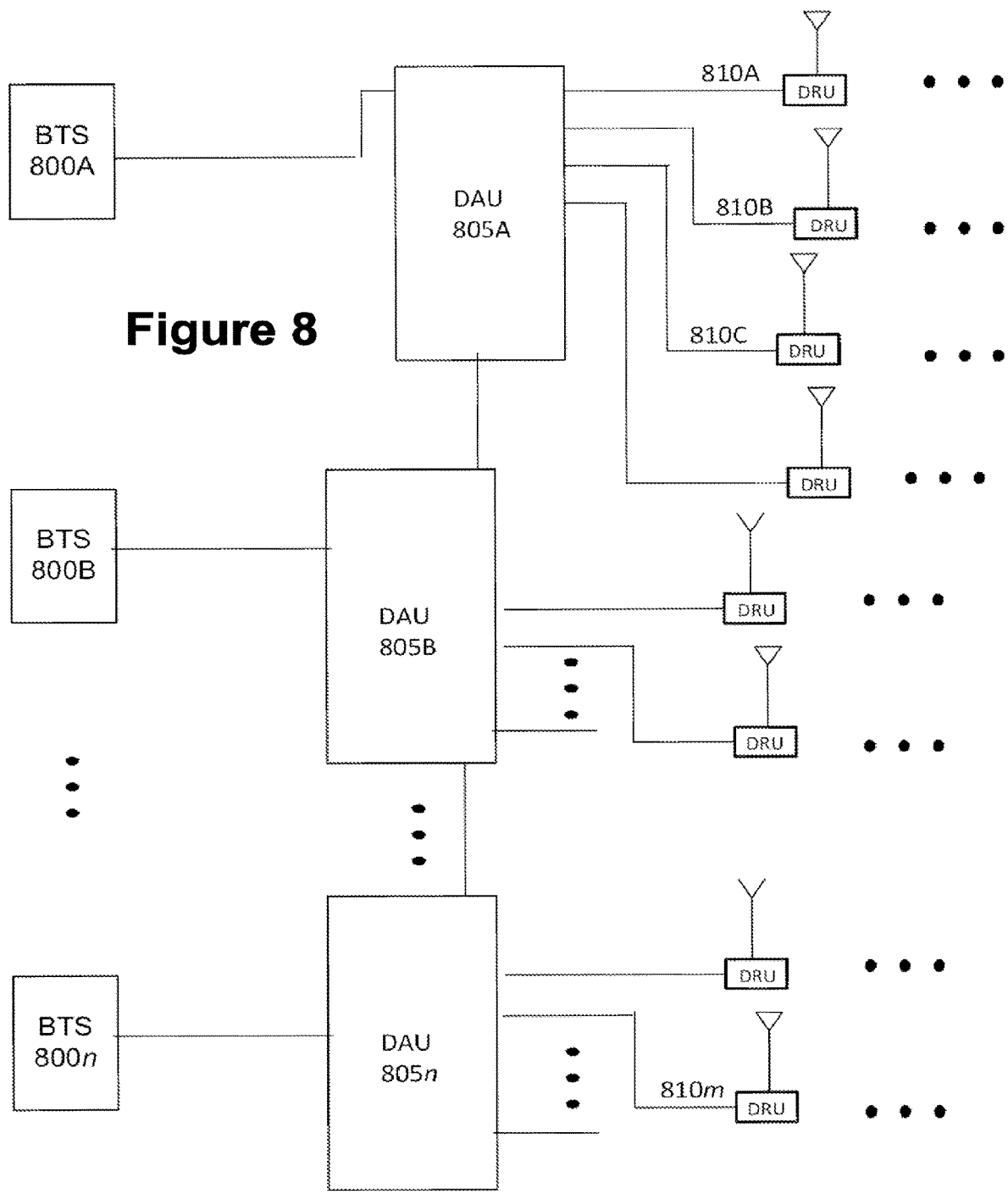
FIG. 8 illustrates in block diagram form an embodiment of a DAS according to an aspect of the invention, including daisy-chained DAU's.

Referring next to FIG. 4, a still further an alternative embodiment of the present invention may be understood. The arrangement illustrated in FIG. 1 comprised downlink signals from two separate base stations belonging to the same wireless operator entering the DAU 105 at input ports 110A and 110p, respectively. In the embodiment of FIG. 4, a first composite signal enters a first DAU 400 at that DAU's RF input port from a base station 405, and a second composite downlink input signal from, e.g., a second base station 410 belonging to a different wireless operator enters DAU 415 at that second DAU's RF input port. DAU 400 directly supports two rings 420 and 425, DAU 415 directly supports two rings 430 and 435, and a ring 440 is shared between DAU 400 and DAU 405. Each of the rings comprises daisy-chained DRU's generally indicated at 445 and connected via, for example, fiber optic links, as discussed in connection with FIG. 1. It will be noted that channels A are transported in the opposite sense as channels B. The downlink channels in subset A are transported counterclockwise around each ring, whereas the channels in subset B are transported in a clockwise sense around each ring. In this embodiment, signals belonging to both the first operator and the second operator are converted and transported to the DRU's 445 on ring 440 because DAU 400 and DAU 405 are daisy-chained through the fiber optic cable 440. This embodiment provides an example of a neutral host wireless system, where multiple wireless operators share a common infrastructure comprised of DAU 400, DAU 415, and DRU's 445. All the previously mentioned features and advantages accrue to each of the two wireless operators. It will further be appreciated that, while FIG. 4 illustrates only two DAU's linked in daisy-chain style, it is possible to daisy chain a larger plurality of DAU's, and the daisy-chained DAU's can also be configured in a ring configuration similar to the manner in which the DRU's are connected. This arranged is illustrated in FIG. 8, below.

As disclosed in U.S. Provisional Application Ser. No. 61/374,593, entitled "Neutral Host Architecture for a Distributed Antenna System," filed Aug. 17, 2010 and again referring to FIG. 1 of the instant patent application, the Digital Up Converters present in the DRU's of the present invention can be programmed to process various signal formats and modulation types including FDMA, CDMA, TDMA, OFDMA and others. Also, the Digital Up Converters present in the respective DRUs can be programmed to operate with signals to be transmitted within various frequency bands subject to the capabilities and limitations of the system architecture disclosed in U.S. Provisional Application Ser. No. 61/374,593, mentioned above. In one embodiment of the present invention where a wideband CDMA signal is present within, e.g., the bandwidth corresponding to a first carrier at the input port to DAU 105, the transmitted signal at the antenna ports of DRU 125A, DRU 1256 and DRUk will be a wideband CDMA signal which is virtually identical to the signal present within the bandwidth corresponding to that first carrier at the input port to DAU 105.

As disclosed in U.S. Provisional Application Ser. No. 61/374,593, again identified above, and also referring to FIG. 1 of the instant patent application, it is to be understood that the Digital Up Converters present in the respective DRUs can be programmed to transmit any desired composite signal format to each of the respective DRU antenna ports. As an example, the Digital Up Converters present in DRU 125A and DRU 125B can be dynamically software-reconfigured as described previously so that the signal present at the antenna port of DRU 125A would correspond to the spectral profile shown in FIG. 1 as 155A and also that the signal present at the antenna port of DRU 125B would correspond to the spectral profile shown in FIG. 1 as 155B. The application for such a dynamic re-arrangement of DRU capacity would be e.g., if a company meeting were suddenly convened in the area of the enterprise corresponding to the coverage area of DRU 125B.

Referring again to FIG. 2, another embodiment of the Distributed Antenna System of the present invention can be better understood. As disclosed in the aforementioned U.S. Provisional Application Ser. No. 61/374,593, and also as shown in FIG. 2, the optical ring transport mechanism can be implemented with regard to uplink signals. As discussed previously with regard to downlink signals and by referring to FIG. 1, the uplink system shown in FIG. 2 is mainly comprised of DAU 105, together with DRU's 125A-125k. In a manner similar to the downlink operation explained by referring to FIG. 1, the operation of the uplink system shown in FIG. 2 can be understood as follows.

The Digital Down Converters present in each of DRU's 125A-k are dynamically software-configured as described previously so that uplink signals of the appropriate desired signal format(s) present at the receive antenna ports of the respective DRU's 125A-125k are selected based on the desired uplink band(s) to be processed and filtered, converted and transported to the appropriate uplink output port of DAU 105. The DAU and DRUs frame the individual data packets corresponding to their respective radio signature using the Common Public Radio Interface (CPRI) standard. Other Interface standards are applicable provided they uniquely identify data packets with respective DRUs. Header information is transmitted along with the data packet which identifies the DRU and DAU that corresponds to the individual data packet.

In one example for the embodiment shown in FIG. 2, DRU's 125A and 125C are configured to receive uplink signals within the Channel K bandwidth, whereas DRU 1256 and DRU 125n are both configured to reject uplink signals within the Channel K bandwidth. When DRU 125C receives a strong enough signal at its receive antenna port within the Channel K bandwidth to be properly filtered and processed, the Digital Down Converters within DRU 125C facilitate processing and conversion. Similarly, when DRU 125A receives a strong enough signal at its receive antenna port within the Channel K bandwidth to be properly filtered and processed, the Digital Down Converters within DRU 125A facilitate processing and conversion. The signals from DRU 125A and DRU 125C are combined based on the active signal combining algorithm, and are fed to the base station connected to the uplink output port of DAU 105. The term simulcast is frequently used to describe the operation of DRU125A and DRU 125C with regard to uplink and downlink signals within Channel K bandwidth. The term Flexible Simulcast refers to the fact that the present invention supports dynamic and/or manual rearrangement of which specific DRU are involved in the signal combining process for each Channel bandwidth.

Referring still to FIG. 2, the Digital Down Converters present in DRU 125A are configured to receive and process signals within Channel J-Q bandwidths. The Digital Down Converters present in DRU 125b are configured to receive and process signals within Channel J, L, M and O bandwidths. The Digital Down Converters present in DRU 125C are configured to receive and process signals within Channel K and O bandwidths. The Digital Down Converters present in DRU 125n are configured to receive and process signals within Channel J, M, N and Q bandwidths. The respective high-speed digital signals resulting from processing performed within each of the four DRU are routed to the DAU. As described previously, the uplink signals from the four DRUs are combined within the respective DAU corresponding to each base station.

In summary, the Reconfigurable Distributed Antenna System of the present invention described herein efficiently conserves resources and reduces costs. The reconfigurable system is adaptive or manually field-programmable, since the algorithms can be adjusted like software in the digital processor at any time.

Figure 5:
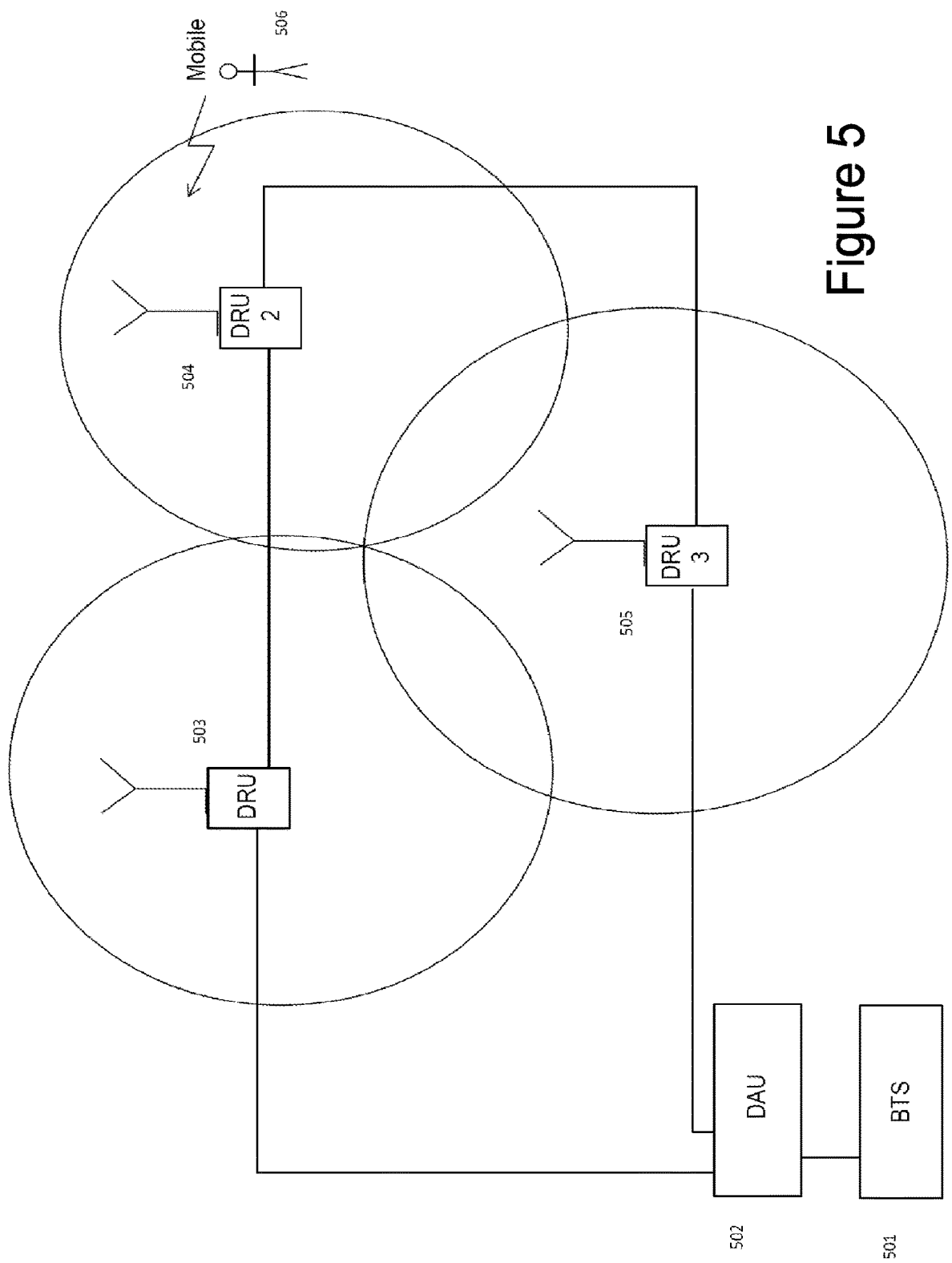
FIG. 5 illustrates an embodiment of a cellular network system employing multiple DRUs according to the present invention.

Referring next to FIG. 5, an alternative embodiment of the present invention may be better understood. FIG. 5 provides a daisy chain example of a distributed antenna system (DAS). Each DRU has a coverage radius that can be adjusted based on the power transmission from that particular remote unit. The DAU controls the various DRU's transmission power and can optimize the overall coverage zone. In the illustrated embodiment, DAU 502, again under the control of a NOC (not shown), is associated with a base station 501 and in turn interfaces with three DRU's 503, 504 and 505. A user 506 with a mobile device is provided relatively uniform coverage throughout the area covered by the three DRU's.

Figure 6:
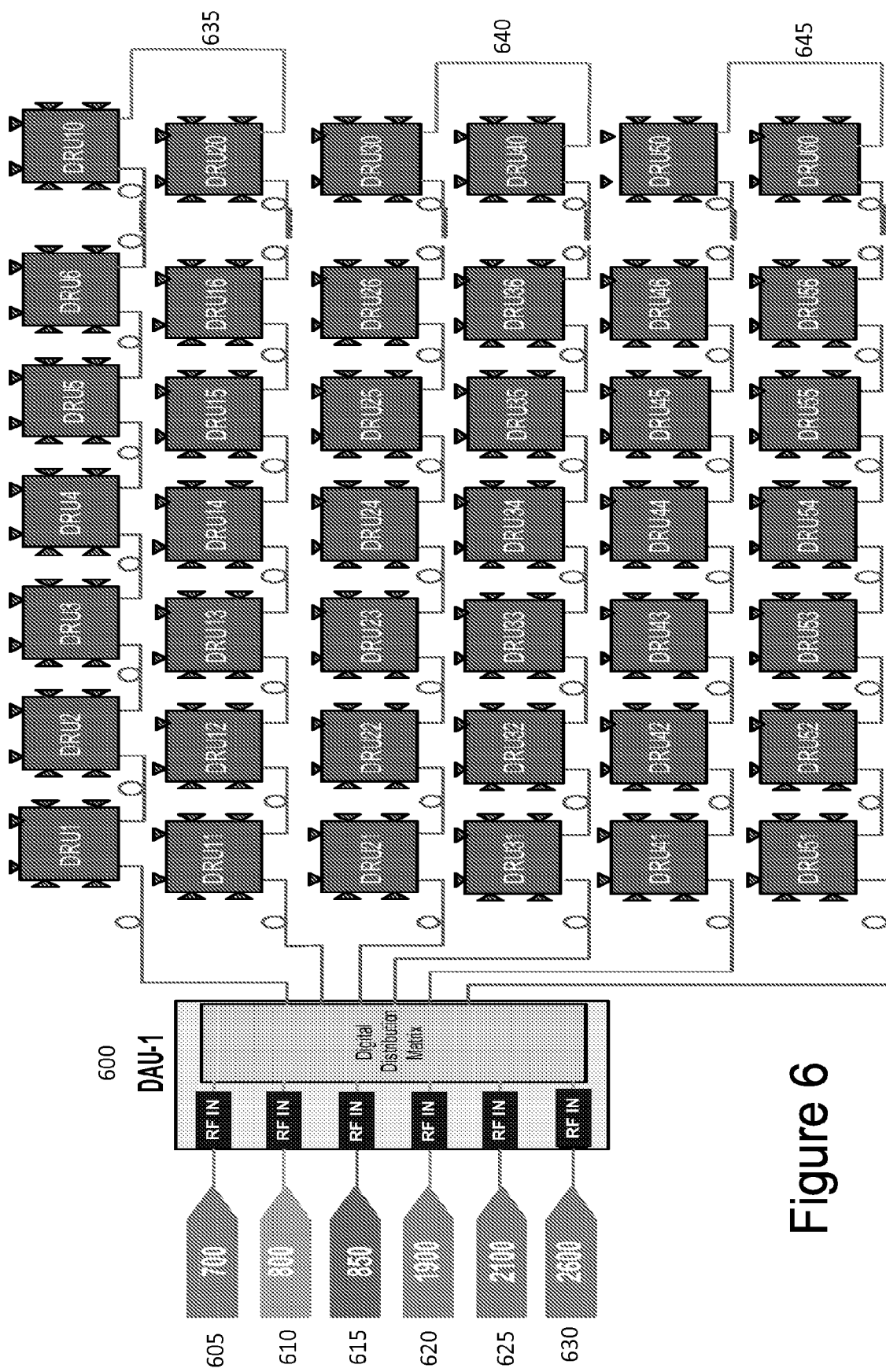
FIG. 6 illustrates an embodiment of a multi-band system employing six different services operating in different frequency channels with multiple DRUs according to the present invention.

Referring next to FIG. 6, a still further alternative embodiment may be better appreciated. FIG. 6 shows an embodiment of a multi-band system illustrating one DAU supporting up to six different services operating at different frequency bands, with three optical rings of DRU's 1-60. The input frequency bands 605-630 (here denoted as six frequency bands at 700, 800, 850, 1900, 2100 and 2600 MHz) are input into the DAU 600 from the BTS's (not shown). The DAU includes, among other functionalities discussed herein, an RF IN portion for each band, and a digital distribution matrix for distributing the frequency bands to a plurality of DRU's, indicated as DRU1-DRU60, daisy-chained along three separate rings 635, 640 and 645 for achieving the desired coverage. The frequency bands are transported to either all or a subset of DRUs. The particular number of frequency bands, DAU's, DRU's and rings is exemplary only, and can, in practice, be any number appropriate to the performance capabilities and needs of the network.

Figure 7:
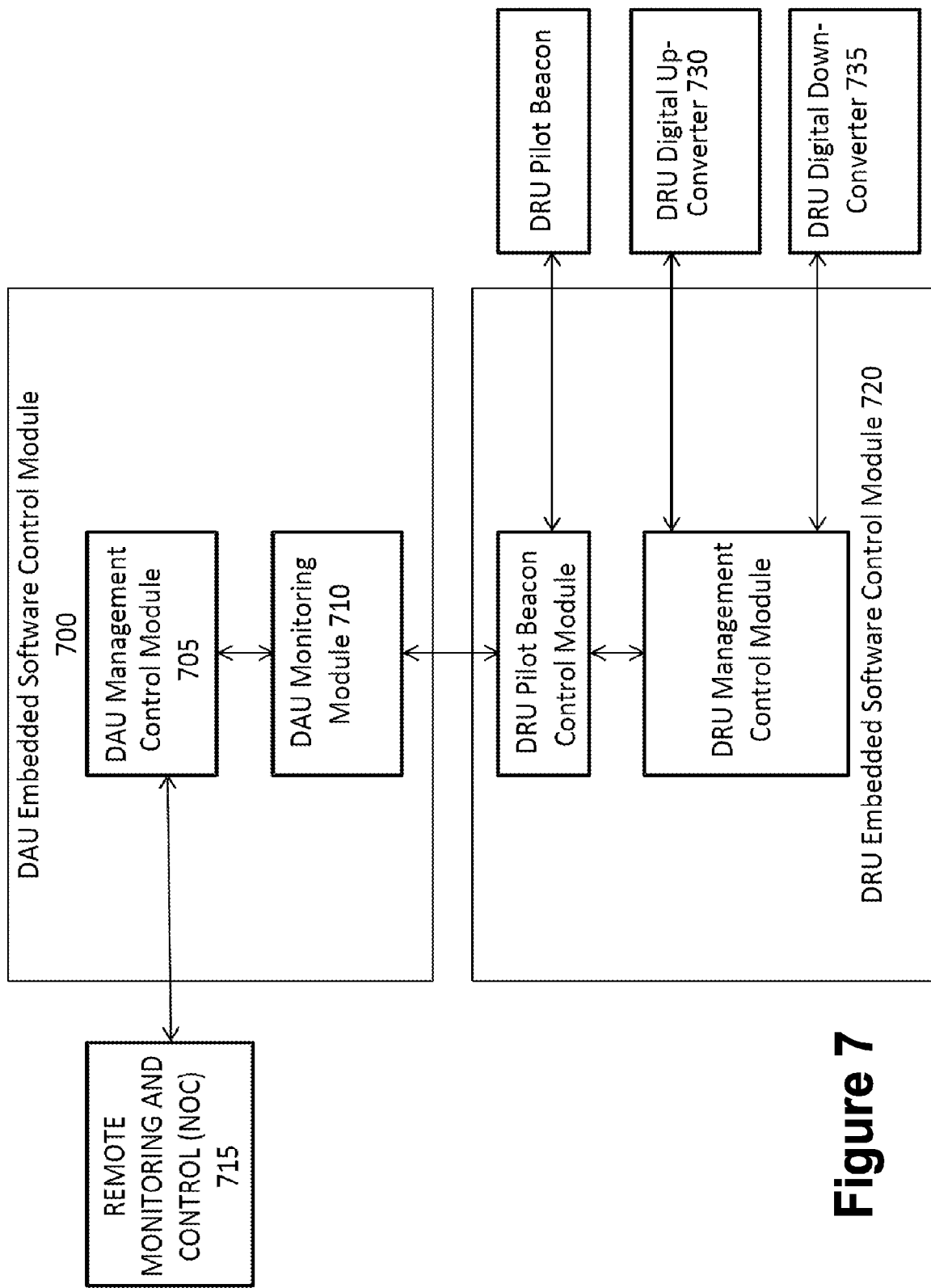
FIG. 7 illustrates in block diagram form the interaction between the DAU embedded software control module and the DRU embedded software control module.

Referring next to FIG. 7 that illustrates embedded software control modules, the software embedded in the DAU and DRU, which controls the operation of key functions of these devices, can be better understood. In particular, the DAU embedded software control module 700 comprises a DAU Management Control Module 705 and a DAU monitoring module 710. The DAU Management Control Module 705 communicates with the NOC 715, and also the DAU monitoring module 710. One such key function is determining and/or setting the appropriate amount of radio resources (such as RF carriers, CDMA codes or TDMA time slots) assigned to a particular DRU or group of DRUs to meet desired capacity and throughput objectives. As noted previously, the NOC 715 monitors the DAS operation and sends commands to the DAU's for configuring various functions of the DRU's as well as the DAU, in at least some embodiments.

The DAU Monitoring module, in addition to other functions, detects which carriers and corresponding time slots are active for each DRU. The DAU Management Control module communicates with the DRU Embedded Software Control module 720 over a fiber optic link control channel via a control protocol. In an embodiment, the control protocol comprises headers together with packets of data, such that both control information and data are transmitted to the DRU's together as a message. DRU functions or features that the header would control in the DRU are typically implementation specific and can include, among other things, measuring uplink and downlink power, measuring gain of uplink and downlink, and monitoring alarms in the DRU.

In turn, the DRU Management Control module 725 within the DRU Embedded Software Control Module sets the individual parameters of all the DRU Digital Up-Converters 730 to enable or disable specific radio resources from being transmitted by a particular DRU or group of DRUs, and also sets the individual parameters of all the DRU Digital Down-Converters 735 to enable or disable specific radio resources from being transmitted by a particular DRU or group of DRUs. In addition, the DRU Embedded Software Control Module comprises a DRU Pilot Beacon Control Module 740, which communicates with a DRU Pilot Beacon 745.

Referring next to FIG. 8, an embodiment of a daisy-chained configuration of DAU's is illustrated, together with a daisy-chained configuration of DRU's. In an embodiment, a plurality of base stations 800A-800n are each associated with one of DAU's 805A-n. The DAU's are daisy-chained, and each DAU communicates with one or more daisy-chains 810A-810m of DRU's which may or may not be arranged in a ring configuration. It will be appreciated that the DAU's can also be configured in a ring configuration, as discussed above.

An algorithm operating within the DAU Monitoring module which detects which carriers and corresponding time slots for each carrier are active for each DRU provides information to the DAU Management Control module to help identify when, e.g., a particular downlink carrier is loaded by a percentage greater than a predetermined threshold whose value is communicated to the DAU Management Control module by the DAU's Remote Monitoring and Control function 715. If that occurs, the DAU Management Control module can adaptively modify the system configuration to begin to deploy, typically although not necessarily slowly, additional radio resources (such as RF carriers, CDMA codes or TDMA time slots) for use by a particular DRU which need those radio resources within its coverage area. At the same time, usually the DAU Management Control module adaptively modifies the system configuration to begin to remove, again typically slowly, certain radio resources (such as RF carriers, CDMA codes or TDMA time slots) for use by a particular DRU where that DRU no longer needs those radio resources within its coverage area.

Although the present invention has been described with reference to the preferred embodiments, it will be understood that the invention is not limited to the details described thereof. Various substitutions and modifications have been suggested in the foregoing description, and others will occur to those of ordinary skill in the art. Therefore, all such substitutions and modifications are intended to be embraced within the scope of the invention as defined in the appended claims.

APPENDIX I

Glossary of Terms

| | |
|---|---|
| ACLR | Adjacent Channel Leakage Ratio |
| ACPR | Adjacent Channel Power Ratio |
| ADC | Analog to Digital Converter |
| AQDM | Analog Quadrature Demodulator |
| AQM | Analog Quadrature Modulator |
| AQDMC | Analog Quadrature Demodulator Corrector |
| AQMC | Analog Quadrature Modulator Corrector |
| BPF | Bandpass Filter |
| BTS | Base Transceiver System or Base Station |
| CDMA | Code Division Multiple Access |
| CFR | Crest Factor Reduction |
| DAC | Digital to Analog Converter |
| DAU | Digital Access Unit |
| DET | Detector |
| DHMPA | Digital Hybrid Mode Power Amplifier |
| DDC | Digital Down Converter |
| DNC | Down Converter |
| DPA | Doherty Power Amplifier |
| DQDM | Digital Quadrature Demodulator |
| DQM | Digital Quadrature Modulator |
| DSP | Digital Signal Processing |
| DUC | Digital Up Converter |
| EER | Envelope Elimination and Restoration |
| EF | Envelope Following |
| ET | Envelope Tracking |
| EVM | Error Vector Magnitude |
| FFLPA | Feedforward Linear Power Amplifier |
| FIR | Finite Impulse Response |
| FPGA | Field-Programmable Gate Array |
| GSM | Global System for Mobile communications |
| I-Q | In-phase/Quadrature |
| IF | Intermediate Frequency |
| LINC | Linear Amplification using Nonlinear Components |
| LO | Local Oscillator |
| LPF | Low Pass Filter |
| MCPA | Multi-Carrier Power Amplifier |
| MDS | Multi-Directional Search |
| OFDM | Orthogonal Frequency Division Multiplexing |
| PA | Power Amplifier |
| PAPR | Peak-to-Average Power Ratio |
| PD | Digital Baseband Predistortion |
| PLL | Phase Locked Loop |
| PN | Pseudo-Noise |
| QAM | Quadrature Amplitude Modulation |
| QPSK | Quadrature Phase Shift Keying |
| RF | Radio Frequency |
| RRH | Remote Radio Head |
| RRU | Remote Radio Head Unit |
| SAW | Surface Acoustic Wave Filter |
| UMTS | Universal Mobile Telecommunications System |
| UPC | Up Converter |
| WCDMA | Wideband Code Division Multiple Access |
| WLAN | Wireless Local Area Network |

What is claimed is:

1. A system for transporting wireless communications, comprising:
   a set of digital access units (DAUs) that receive a set of radio resources from one or more signal sources including:
   a first DAU that provides a first subset of the set of radio resources, and
   a second DAU that is communicatively coupled to the first DAU and provides a second subset of the set of radio resources; and
   two or more remote units, including:
   a first remote unit that is communicatively coupled to the first DAU and includes a first antenna for transmitting the first subset of the set of radio resources, wherein the first remote unit is included in a first set of remote units, and the remote units in the first set of remote units are daisy-chained such that each remote unit is linked to a next remote unit by a single bi-directional optical fiber, and
   a second remote unit that is communicatively coupled to the second DAU and includes a second antenna for transmitting the second subset of the set of radio resources,
   wherein a first number of radio resources in the first subset is different than a second number of radio resources in the second subset.

2. The system of claim 1, wherein:
   the two or more remote units further includes a second set of remote units,
   at least one remote unit included in the second set of remote units is communicatively coupled to the first DAU, and
   the remote units in the second set of remote units are daisy-chained such that each remote unit is linked to a next remote unit by a single bi-directional optical fiber.

3. The system of claim 1, wherein each remote unit in the first set of remote units are connected to a separate daisy chain such that each remote unit in the separate daisy chain is linked to another remote unit in the separate daisy chain by a single bi-directional optical fiber.

4. The system of claim 1, wherein the first DAU receives the first subset of the set of radio resources as a first set of downlink (DL) channels from the one or more signal sources and sends the first set of downlink channels to the first set of remote units.

5. The system of claim 1, wherein the set of DAUs receive digital signals from the two or more remote units.

6. The system of claim 5, wherein the digital signals comprise a first set of uplink (UL) channels.

7. The system of claim 1, wherein:
   the second remote unit is included in a second set of remote units, and
   the remote units in the second set of remote units are daisy-chained such that each remote unit is linked to a next remote unit by a single bi-directional optical fiber.

8. The system of claim 1, wherein the first subset of the set of radio resources includes a plurality of downlink channels that include multiple frequency bands or multiple carriers.

9. The system of claim 1, further comprising a resource management unit that set the first subset of the set of radio resources and the second subset of the set of radio resources.

10. The system of claim 9, wherein:
    the resource management unit determines that at least one of first subset of the set of radio resources or the second subset of the set of radio resources exceeds a load management threshold; and in response, the resource management unit modifies at least one of the first number of radio resources or the second number of radio resources.

11. The system of claim 1, wherein:
the first DAU provides the first number of radio resources in the first subset at a first time, and
the first DAU provides a modified number of radio resources in the first subset at a subsequent time.

12. The system of claim 1, wherein:
a first downlink channel is included in the first subset of the set of radio resources and not included in the second subset of the set of radio resources;
a second downlink channel is not included in the first subset of the set of radio resources and is included in the second subset of the set of radio resources;
a third downlink channel is included in both the first subset of the set of radio resources and the second subset of the set of radio resources.

13. The system of claim 1, wherein the set of radio resources comprises baseband and the set of DAUs converts the baseband into one or more digital representations of the set of radio resources.

14. The system of claim 13, wherein the one or more digital representations of the set of radio resources comprise one or more digital signals.

15. The system of claim 1, wherein the set of radio resources comprises a set of radio frequency (RF) signals and the set of DAUs converts the set of RF signals into one or more digital representations of the set of radio resources.

16. The system of claim 1, wherein the set of DAUs further includes a third DAU that is communicatively coupled to the first DAU and provides a third subset of the set of radio resources.

17. The system of claim 1, wherein the first DAU receives the first subset from a first base station, and the second DAU receives the second subset from a second base station.

18. A method for transporting wireless communications, the method comprising:
receiving, by a set of digital access units (DAUs) from one or more signal sources, a set of radio resources, wherein the set of DAUs includes a first DAU, and a second DAU that is communicatively coupled to the first DAU; and
providing, by the first DAU to a first remote unit communicatively coupled to the first DAU, a first subset of the set of radio resources, wherein the first remote unit includes a first antenna for transmitting the first subset of the set of radio resources, and wherein the first remote unit is included in a first set of remote units, and the remote units in the first set of remote units are daisy-chained such that each remote unit is linked to a next remote unit by a single bi-directional optical fiber; and
providing, by the second DAU to a second remote unit communicatively coupled to the second DAU, a second subset of the set of radio resources, wherein:
the second remote unit includes a second antenna for transmitting the second subset of the set of radio resources, and
a first number of radio resources in the first subset is different than a second number of radio resources in the second subset.

19. One or more non-transitory computer-readable storage media storing instructions that, when executed by one or more processors, cause the one or more processors to perform the steps of:
receiving, by a set of digital access units (DAUs) from one or more signal sources, a set of radio resources, wherein the set of DAUs includes a first DAU, and a second DAU that is communicatively coupled to the first DAU; and
providing, by the first DAU to a first remote unit communicatively coupled to the first DAU, a first subset of the set of radio resources, wherein the first remote unit includes a first antenna for transmitting the first subset of the set of radio resources, and wherein the first remote unit is included in a first set of remote units, and the remote units in the first set of remote units are daisy-chained such that each remote unit is linked to a next remote unit by a single bi-directional optical fiber; and
providing, by the second DAU to a second remote unit communicatively coupled to the second DAU, a second subset of the set of radio resources, wherein:
the second remote unit includes a second antenna for transmitting the second subset of the set of radio resources, and
a first number of radio resources in the first subset is different than a second number of radio resources in the second subset.

* * * * *